United States Patent
Hendricks

(10) Patent No.: US 12,119,983 B2
(45) Date of Patent: Oct. 15, 2024

(54) SYSTEM AND METHOD FOR DATA FILTERING AND TRANSMISSION MANAGEMENT

(71) Applicant: FARMBOT HOLDINGS PTY LTD, Naremburn (AU)

(72) Inventor: Craig Hendricks, Naremburn (AU)

(73) Assignee: FARMBOT HOLDINGS PTY LTD, Naremburn (AU)

( * ) Notice: Subject to any disclaimer, the term of this patent is extended or adjusted under 35 U.S.C. 154(b) by 0 days.

(21) Appl. No.: 17/753,680

(22) PCT Filed: Sep. 10, 2020

(86) PCT No.: PCT/AU2020/050964
§ 371 (c)(1),
(2) Date: Mar. 10, 2022

(87) PCT Pub. No.: WO2021/046610
PCT Pub. Date: Mar. 18, 2021

(65) Prior Publication Data
US 2022/0345355 A1    Oct. 27, 2022

(30) Foreign Application Priority Data
Sep. 12, 2019    (AU) .................................. 2019903403

(51) Int. Cl.
*H04L 41/0604* (2022.01)
*H04L 41/22* (2022.01)
*H04L 43/02* (2022.01)

(52) U.S. Cl.
CPC .......... *H04L 41/0622* (2013.01); *H04L 41/22* (2013.01); *H04L 43/02* (2013.01)

(58) Field of Classification Search
None
See application file for complete search history.

(56) References Cited

U.S. PATENT DOCUMENTS

2004/0098611 A1 *  5/2004  Bean ....................... H04L 41/22
709/217
2004/0267691 A1 * 12/2004  Vasudeva ............ G06F 11/3409
(Continued)

FOREIGN PATENT DOCUMENTS

WO    2019028269    2/2019

OTHER PUBLICATIONS

Application No. PCT/AU2020/050964 International Search Report dated Nov. 11, 2020.
(Continued)

*Primary Examiner* — Joshua Joo
(74) *Attorney, Agent, or Firm* — Keller Preece PLLC

(57) ABSTRACT

A system and method for data filtering and transmission management are provided. In particular, disclosed is a method of transmission management for data acquired by a remote monitor having a sensor. The method comprises the steps of: defining an initial trend envelope having a window around a forecast trend gradient, the window defined by an initial upper bound and an initial lower bound; and processing a set of data points acquired by the sensor, to identify any data points outside the initial trend envelope. When a point is identified outside the initial trend envelope, the method: (i) transmits an event data packet to a central server; and (ii) identifies a subsequent trend envelope based on a trend gradient derived from a preceding set of data points, said preceding set of points including an identified point from the event data packet.

21 Claims, 18 Drawing Sheets

(56) References Cited

U.S. PATENT DOCUMENTS

| | | | |
|---|---|---|---|
| 2005/0210340 A1 | 9/2005 | Townsend et al. | |
| 2008/0275618 A1 | 11/2008 | Grimm et al. | |
| 2014/0062669 A1 | 3/2014 | Mena et al. | |
| 2014/0118138 A1 | 5/2014 | Cobelli et al. | |
| 2016/0284108 A1* | 9/2016 | Wang | G06F 3/0482 |
| 2017/0075749 A1* | 3/2017 | Ambichl | G06F 11/3072 |
| 2017/0149644 A1* | 5/2017 | Rapoport | G06F 11/3476 |
| 2017/0359194 A1 | 12/2017 | Cibaud et al. | |
| 2020/0007405 A1* | 1/2020 | Chitalia | G06F 9/5072 |
| 2020/0014730 A1* | 1/2020 | Luotojarvi | H04L 63/20 |
| 2021/0168042 A1* | 6/2021 | Mijumbi | H04L 41/147 |
| 2021/0314231 A1* | 10/2021 | Madhavan | H04L 43/0894 |
| 2021/0320939 A1* | 10/2021 | Salunke | G06F 11/3423 |

OTHER PUBLICATIONS

Application No. PCT/AU2020/050964 Written Opinion of the International Searching Authority dated Nov. 11, 2020.
Application No. PCT/AU2020/050964 International Preliminary Report on Patentability dated Dec. 23, 2021.

* cited by examiner

SYSTEM AND METHOD FOR DATA FILTERING AND TRANSMISSION MANAGEMENT

RELATED APPLICATION

This application is related to Australian Provisional Patent Application No. 2019903403 titled "System and method for data filtering and transmission management" and filed 12 Sep. 2019 in the name of Farmbot Holdings Pty Ltd, the entire content of which is incorporated by reference as if fully set forth herein.

TECHNICAL FIELD

The present disclosure relates to a system and method for data transmission. In particular, the present disclosure relates to a system and method for data filtering and transmission management based on data analytics.

BACKGROUND

In the modern world, it has become common to transmit large amounts of data between computing devices, using various forms of communications networks. The communications networks may include one or more wired or wireless links, including the Internet. In particular, streaming of multimedia content for television viewing and gaming applications requires large bandwidth from a remote computing device to a local computing device, in order to deliver high definition content with low latency. Businesses also transmit ever increasing quantities of data, as traditional data storage devices, such as co-located data servers, are replaced by cloud-based storage solutions.

There is also an increasing need to transmit data from remotely located computing devices. Wireless communications networks, including cellular telephony, satellite networks, Wi-Fi, and the like, have enabled people to have great freedom in their personal and working lives, while still remaining in communication with family, friends, colleagues, clients, and vendors.

The Internet has become an extremely pervasive component of modern life and is no longer restricted to traditional computing devices, such as personal computers and the like. Rather, there is a steady extension of Internet connectivity into many devices, including everyday devices and domestic appliances. Equipping devices with "smart" technology that enables those devices to communicate with other devices, either locally or remotely, has been broadly termed the Internet of Things (IoT). IoT devices span commercial and consumer spaces and are used across many applications, including, but not limited to, security, navigation, automation, data analytics, and healthcare. As the availability of IoT devices increases and those devices are deployed, there is an ever increasing volume of data being transmitted.

In large urban centres, transmission bandwidth is continually being increased through the provision of increased physical media, such as networks utilising fibre optic cables, copper cabling, coaxial cabling, and combinations thereof. Increased wireless bandwidth is being made available through the allocation of different wireless frequencies and emerging technologies, such as 5G cellular telephony.

As the demand to deliver increased volumes of content is outstripping the available bandwidth of the present networks, there is a need to transport data efficiently within the available transmission media. There are a number of situations in which efficient data transmission is particularly important. In rural communities, data is often transmitted by expensive transmission media, such as satellite channels. There is also an increasing number of devices that are powered by battery, rather than mains power. Whilst such battery-powered devices are more flexible and can be located anywhere, receiving and sending wireless communications causes a large load on the batteries, which can result in a shorter operational life before battery recharging or battery replacement. Thus, in order to minimise use of expensive transmission media or extend the battery life of battery-powered devices, it is necessary to optimise the transmission of data, while still achieving a desired level of service.

One approach is to schedule a computing device to transmit data at fixed periodic intervals or in accordance with a predefined schedule (e.g., every second, minute, hour, 12 hours, daily, etc.). This provides a user with certainty as to the timing of data to be transmitted. However, transmitting data at fixed periodic intervals often results in data being transmitted that is of little or no value. For example, if there has not been any change since a preceding transmission, then transmitting data again, merely because the transmission is scheduled, uses bandwidth and the user may be paying for unnecessary use of a transmission network or the computing device may be using valuable battery resources, or both, without any benefit. Further, if the computing device detects a change shortly after a data transmission has taken place and there is a significant time between scheduled transmissions, the change is not reported until the next periodic interval has passed and the next scheduled transmission occurs. Such delays can be important for businesses and even be dangerous, resulting in damage to equipment or assets, or injuries to personnel.

Another issue that arise from using a predefined schedule is that a system will typically send a data sample obtained at or immediately preceding the scheduled time. Consequently, the data sample obtained and transmitted may not necessarily include or reflect any significant events that may have occurred during the preceding interval.

In order for systems that use predefined transmission schedules to obtain all relevant data for post-processing, the periodic transmission intervals need to be relatively short, resulting in many transmissions and thus expensive telecommunications costs.

Thus, a need exists to provide an improved method and system for data transmission.

SUMMARY

The present disclosure relates to a system and method for data filtering and transmission management based on data analytics.

A first aspect of the present disclosure provides a method of transmission management for data acquired by a remote monitor having a sensor, said method comprising the steps of:

defining an initial trend envelope, said initial trend envelope having a window around a forecast trend gradient, said window defined by an initial upper bound and an initial lower bound;

processing a set of data points acquired by said sensor, to identify any data points outside said initial trend envelope; and when a point is identified outside said initial trend envelope:
(i) transmitting an event data packet to a central server, said data packet including said identified data point, a gradient associated with said identified data point, and a set of history points selected from said set of data points acquired by said sensor; and (ii) identifying a subsequent trend envelope based on a trend gradient derived from a preceding set of data points, said preceding set of points including said identified point.

A second aspect of the present disclosure provides a remote monitor comprising:

a sensor;
a database for storing data acquired by said sensor;
a transmitter;
a processor; and
a memory storing computer code instructions that when executed on the processor perform the method steps of:

defining an initial trend envelope for data acquired by said sensor, said initial trend envelope having a window around a forecast trend gradient, said window defined by an initial upper bound and an initial lower bound;

processing a set of data points acquired by said sensor, to identify any data points outside said initial trend envelope;

when a point is identified outside said initial trend envelope:

(i) transmitting by said transmitter, to a central server, an event data packet, said event data packet including said identified data point, a gradient associated with the identified data point, and a set of history points selected from the set of data points acquired by the sensor; and (ii) identifying a subsequent trend envelope based on a trend gradient derived from a preceding set of data points, said preceding set of points including said identified point.

A third aspect of the present disclosure provides a remote monitoring system comprising:

a remote monitor comprising:
a sensor;
a database for storing data acquired by said sensor;
a transmitter for coupling to a communications network;
a processor; and
a memory storing computer code instructions that when executed on the processor perform the method steps of:

defining an initial trend envelope for data acquired by said sensor, said initial trend envelope having a window around a forecast trend gradient, said window defined by an initial upper bound and an initial lower bound;

processing a set of data points acquired by said sensor, to identify any data points outside said initial trend envelope;

when a point is identified outside said initial trend envelope:

(i) transmitting by said transmitter an event data packet, said event data packet including said identified data point, a gradient associated with the identified data point, and a set of history points selected from the set of data points acquired by the sensor; and (ii) identifying a subsequent trend envelope based on a trend gradient derived from a preceding set of data points, said preceding set of points including said identified point; and a central server coupled to said communications network, said central server adapted to:

receive said transmitted event data packet; and display a dashboard to a user computing device, said dashboard displaying information based on said event data packet transmitted from said remote monitor.

In one or more arrangements, the information displayed on the dashboard includes received data points, as well as a forecast of the current level. The forecast may be based on the last received data point and a gradient associated with that data point.

According to another aspect, the present disclosure provides an apparatus for implementing any one of the aforementioned methods.

According to another aspect, the present disclosure provides a computer program product including a computer readable medium having recorded thereon a computer program that when executed on a processor of a computer implements any one of the methods described above.

Other aspects of the present disclosure are also provided.

BRIEF DESCRIPTION OF THE DRAWINGS

One or more embodiments of the present disclosure will now be described by way of specific example(s) with reference to the accompanying drawings, in which.

In the accompanying drawings, features and method steps that have the same reference numerals are to be considered to have the same function(s) or operation(s), unless a contrary intention is expressed or implied.

DETAILED DESCRIPTION

Figure 1:
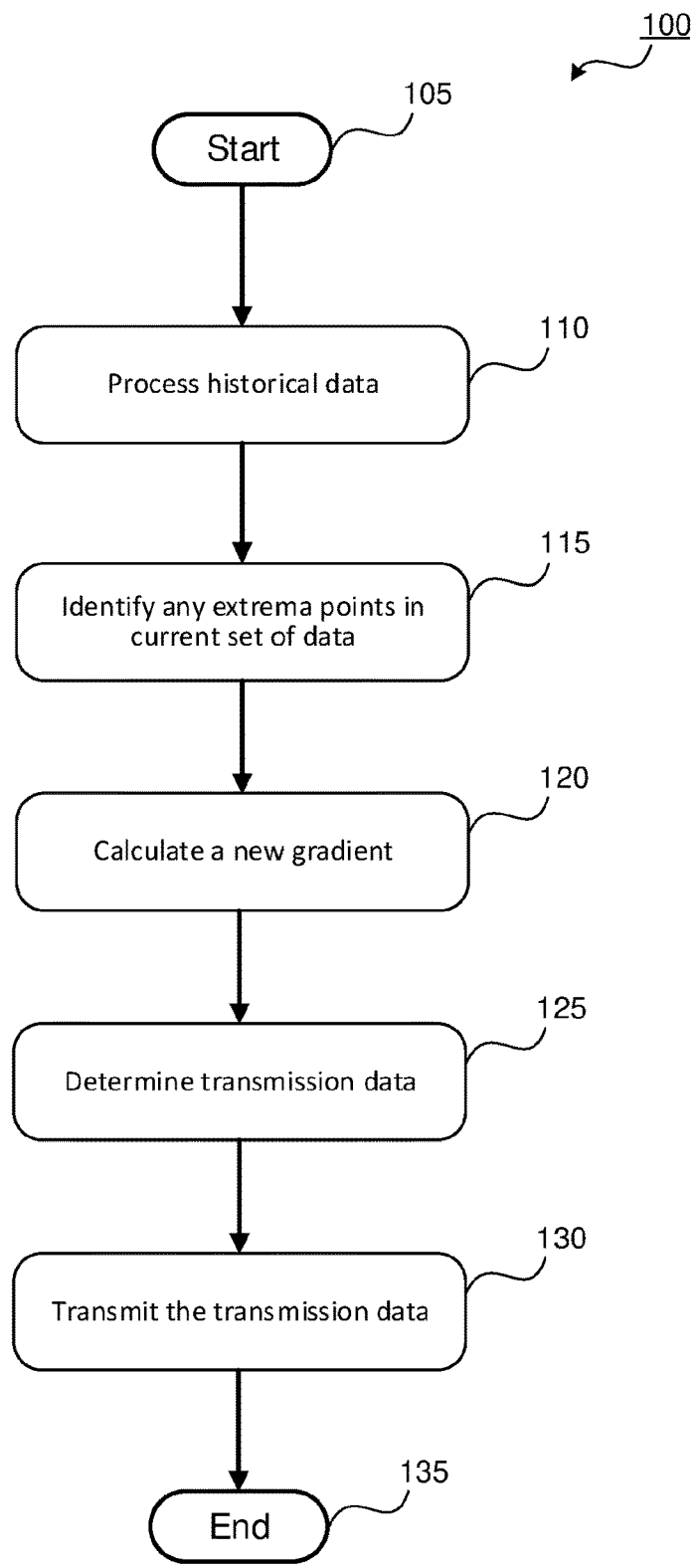
FIG. 1 is a flow diagram of a method for data filtering and transmission management.

The present disclosure provides a system and method for data filtering and transmission management, based on the use of data analytics. The system and method use data analytics to determine what data to transmit and when to transmit that data, in order to use resources efficiently. In particular, the data analytics identify notable changes and determine a relevant set of data to transmit in order to report those notable changes.

The system and method of the present disclosure utilise data analytics to identify trends and optionally perform other time series data analysis to determine which data to send and when to send that data, as well as enabling the forecasting of data points between transmission points. Sending data when it is most relevant and minimising transmission times saves power and money.

In one arrangement, the method determines trends from sampled data and identifies notable extrema points within a time period in order to optimise the data transmitted over a limited bandwidth connection. Extrema points are the local maximum points and minimum points within a given range. Performing such trend analysis and identifying notable extrema points enables the generation of a forecast for a future time period.

The method performs longitudinal data tracking for a time series of data points over a first time period, wherein the data points relate to a characteristic of a system. For example, the characteristic may be a water level, humidity level, temperature, barometric pressure, or any other quantity value for which values are sensed over time. The method determines an operating range for the characteristic. The operating range is a trend envelope surrounding a trend gradient and may be determined by user input, or by analysing an initial set of data or a historical set of data and determining a range that is based on a predefined deviation from an average or median for a given operating characteristic or set of operating characteristics. The predefined deviation may be hard-coded or user-defined or refined by machine learning, depending on the implementation. The method identifies notable changes relative to the operating range and consequently determines a relevant set of data to transmit in order to report those notable changes. For example, the method identifies a data point that is outside the operating range, being greater than a predefined deviation from a trend gradient, and determines that such a data point is worthy of reporting.

Some applications benefit or require delivery of data in real-time or near real-time. Conversely, some applications do not benefit from real-time delivery of data. The system and method of the present disclosure provide responsive transmission management that stores data movements that are not time critical, but responds swiftly with complete history when changes are significant within a particular context.

The system and method of the present disclosure may be applied to many different use cases. Throughout this specification, the system and method will be described with reference to particular use cases relating to remote monitoring, such as may occur in agricultural environments. However, it will be appreciated by a person skilled in the art that the use cases described herein are illustrative and not restrictive.

Overall Flow

FIG. 1 is a flow diagram of a method 100 for data filtering and transmission management in accordance with the present disclosure. The method 100 begins at a Start step 105 and proceeds to step 110, which processes a set of data that has been collected over time pertaining to a particular characteristic of a system. In one application, the data relates to sensed data acquired from a sensor. This is referred to within this specification as longitudinal data tracking. The data processing performed in step 110 may include trend and other time series data analytics that allow for the optimisation of data transmission.

Control passes from step 110 to step 115, which processes a current period of data for a given characteristic that is being monitored, in order to identify any points that are outside a predefined range of a trend identified in step 110 for that time series of sensed data points. The data processing includes heuristic logic to optimise data detail while minimising transmission. Identifying extrema points helps ensure irrelevant data movements and sensor jitter do not result in any unnecessary data transmission that consume expensive bandwidth, as the system determines that the more important extrema points within a given time frame will be transmitted.

Control passes to step 120, which determines a forecast for the characteristic. Control then passes from step 120 to step 125, which determines transmission data to be sent and whether the transmission data is to be sent immediately or at a next scheduled transmission interval. In one embodiment, the transmission data to be sent is restricted by a size of a transmission data packet. Such data packets may be governed by the particular transmission medium.

In one example, step 125 determines that transmission data is to be sent immediately, as a point has been detected outside a current trend window. The identification of a data point outside the trend window may be referred to as an "event", with the transmission data to be sent in an event data packet. The event data packet includes a most recent data point that is an extrema point outside the predefined trend range and a gradient associated with that most recent data point, along with a set of history points for a most recent time period. The set of history points are selected from the extrema points identified in step 110. The event data packet may optionally include other housekeeping data.

In another example, step 125 determines that transmission data is to be sent as a predefined period of time has passed since a preceding data transmission, corresponding to a "timeout". In this example, a timeout data packet is sent that includes a most recent data point and a gradient associated with that data point, along with a set of history points for the most recent time period. The set of history points are selected from the extrema points identified in step 110. The timeout data packet may optionally include other housekeeping data. The housekeeping data for the event data packet and the timeout data packet may include, for example, but is not limited to, time, date, GPS location, redundancy or error correction data, and the like.

Control passes to step 130, which transmits the transmission data at the relevant time. Control then passes to an End step 135 and the method 100 terminates.

Transmission Data Packet

Figure 12:
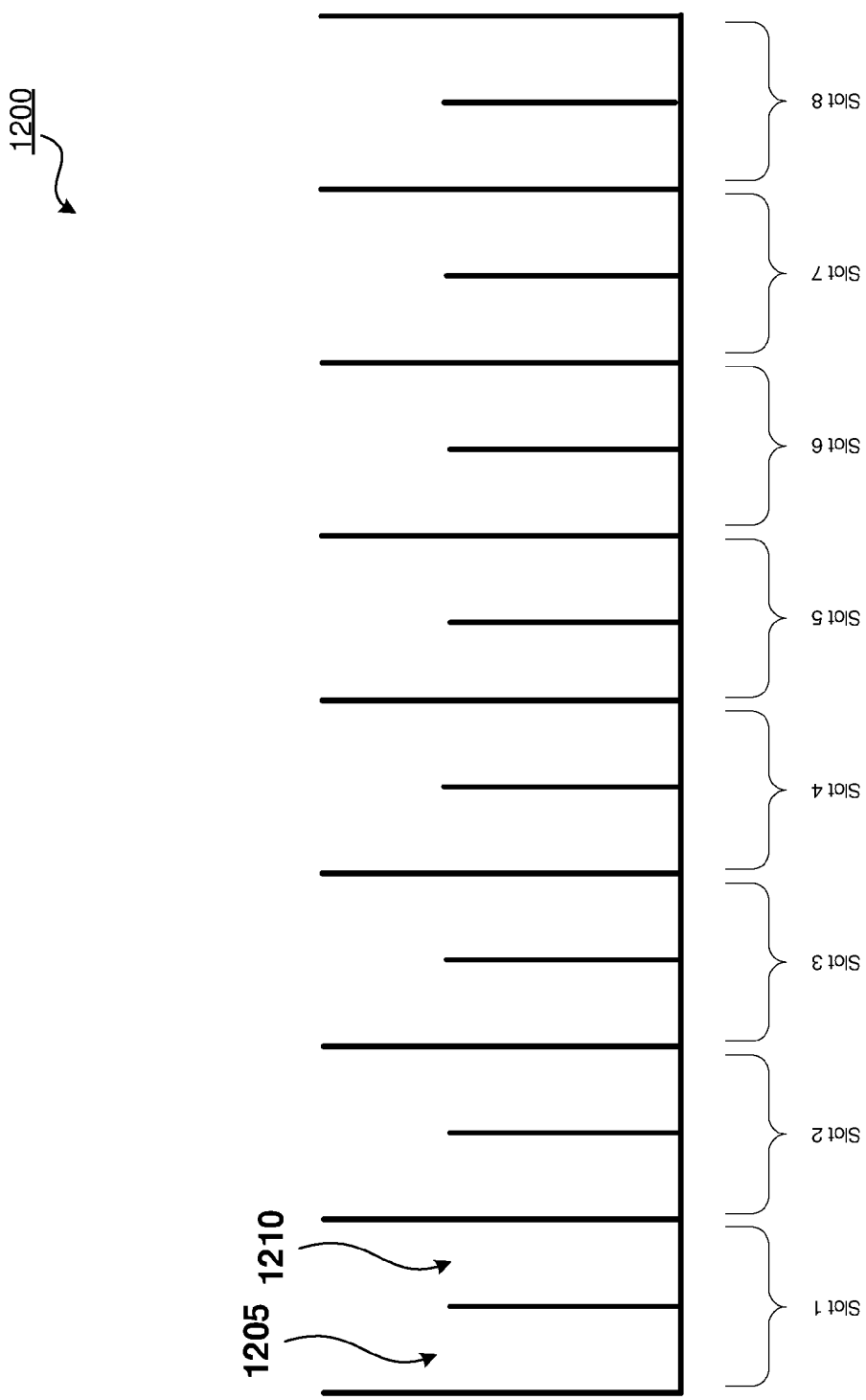
FIG. 12 is a schematic representation of an example of an event data packet.

FIG. 12 is a schematic representation of a transmission data packet 1200, which may be either an event data packet or a timeout data packet. The transmission data packet 1200 in this example has 8 slots, each of which relates to a data point to be transmitted. Each of the 8 slots includes an offset component and a value component. For example, Slot 1 includes an offset component 1205, which provides a time offset from a predefined point in time, such as the most recent transmission time. Slot 1 also includes a value component 1210, which stores a measured value for a characteristic of interest. For example, in a use case in which a level of water in a reservoir is the characteristic of interest, the offset component 1205 may be "10", indicating 10 minutes since the preceding transmission, and the value component 1210 may be "120", indicating a level of 120 mm. The example of FIG. 12 shows 8 slots for transmitting data points. As described above with reference to FIG. 1, the transmission data packet 1200 may optionally include housekeeping data, which may or may not be stored and transmitted using the same offset component and value component as described with reference to Slot 1.

System Diagram

Figure 2:
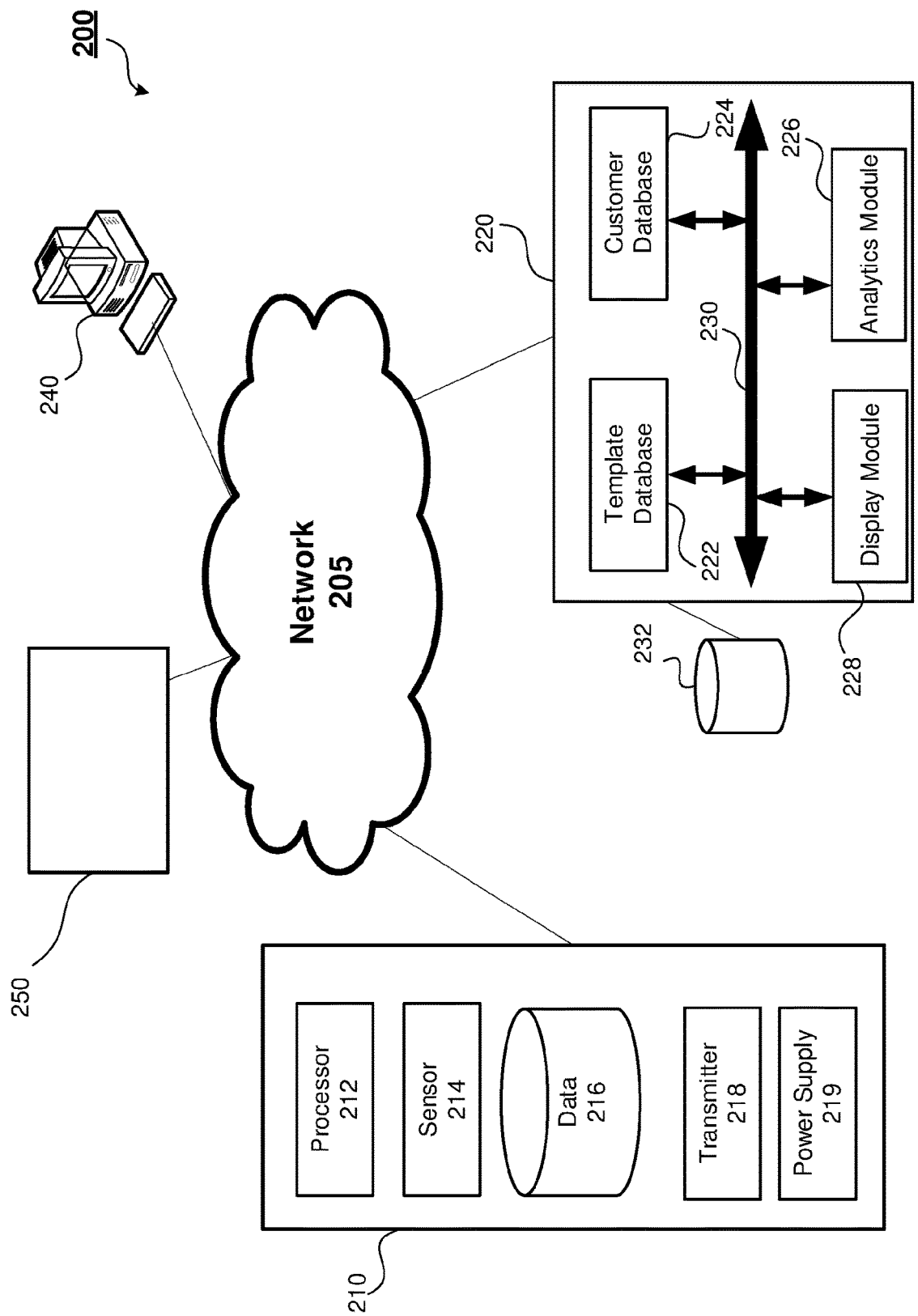
FIG. 2 is a schematic representation of a system on which one or more embodiments of the present disclosure may be practised.

FIG. 2 is a schematic block diagram representation of a system 200 on which one or more embodiments of the present disclosure may be practised. The system 200 includes a first remote monitor 210 equipped with a processor 212, a sensor 214, a data storage module 216, and a transmitter 218. The transmitter 218 couples the first remote monitor 210 to a communications network 205. The first remote monitor 210 also includes a power supply 219. Depending on the implementation, the power supply 219 may be a connection to a mains power supply. Alternatively, the power supply 2190 may be a battery. In one arrangement, the first remote monitor 210 includes one or more solar panels connected to a battery-implemented power supply 219. In one arrangement, the sensor 214 senses a charge level of the power supply 219.

In some embodiments, the first remote monitor 210 is implemented using a custom-built computing device. Alternative embodiments of the remote monitor 210 may be equally practised utilising other programmable computing devices that when programmed and configured in accordance with the present disclosure form an improved computing device having remote monitoring capabilities. In one implementation, the processor 212 is a low power, ARM Cortex M4 processor and the data storage module 216 is implemented using one or more of a computer readable Random Access Memory (RAM) (e.g., a 200 kB RAM memory—for storing dynamic program data and volatile data), an EEPROM (e.g., a 16 kB EEPROM—for storing control library parameters and all data that requires persistence across reboot), and a flash memory (e.g., a Secure Digital (SD) memory card—for storing permanent data sensor sample storage, device configuration parameters, and factory set firmware), or the like. The data storage module 216 may be utilised to store updateable algorithm control parameters, one or more applications for execution on the processor 212, and sensed data.

The sensor 214 is coupled to the processor using an appropriate input/output (I/O) interface. The actual I/O interface depends on the type of sensor, but may include, for example, one or more of: an analog to digital converter (ADC), 4-20 mA process signal interface, digital signal interface, 1-Wire, serial interface, or the like. In some embodiments, the transmitter 218 includes a Long Range (LoRa) radio transmitter, Wi-Fi transmitter, Bluetooth transmitter, or other wireless transmitter for coupling one or more wireless sensor modules 214 to the processor 212. Depending on the implementation, the transmitter 218 may also include one or more of a satellite transmitter, cellular telephony transmitter, or other wired or wireless transmitter to couple the remote monitor 210 to the communications network 205. The actual implementation of the transmitter 218 may depend on the actual implementation, as different industries and site locations will have different requirements.

The power supply 219 may be implemented, for example, using mains power, one or more solar cells, one or more rechargeable batteries, or a combination thereof. Suitable rechargeable batteries may include, for example, lithium-iron phosphate (LFP or $LiFePO_4$) batteries.

The communications network 205 may comprise one or more wired communications links, wireless communications links, or any combination thereof. In particular, the communications network 205 may include a local area network (LAN), a wide area network (WAN), a telecommunications network, or any combination thereof. A telecommunications network may include, but is not limited to, a telephony network, such as a Public Switch Telephony Network (PSTN) or a cellular mobile telephony network, the Internet, or any combination thereof.

The sensor 214 senses time series trending data relating to one or more characteristics that are associated with physical constraints on rapid change. For example, the sensor 214 may be one or more of a thermometer, barometer, fluid level sensor, salinity sensor, battery sensor or the like. While FIG. 2 shows the first remote sensor 210 with a single sensor 214, different embodiments may include multiple sensors for acquiring different time series data relating to different characteristics or for redundancy purposes.

The system 200 also includes a central server 220 coupled to the communications network 205. The central server 220 hosts an application for monitoring data acquired by the sensor 214 of the first remote monitor 210. In the example of FIG. 2, the central server 220 includes a template database 222, a customer database 224, a display module 228, and an analytics module 226, each which is coupled to a central bus 230 enabling the exchange of data among the components of the central server 220.

The customer database 224 stores a user profile for each user registered with the application. Each user profile includes information pertaining to the associated user. Such user information may include, for example, but is not limited to, username, password, contact details, role, access privileges, and the like. Access privileges may define, for example, a set of data to which that user has access and/or the format in which such data is presented on a dashboard. The set of data may be, for example, a set of data received from the first remote monitor 210 or may define one or more computing devices from which data are received.

The template database 222 stores templates for use in a graphical user interface presented by the central server 220 to a user computing device 240 accessed by a user to communicate with the application executing on the central server 220. Depending on the state of the application, the display module 228 selects one or more stored templates from the template database 222 to present to a display of the user computing device 240. The user computing device 240 is shown as a desktop computer, but in practice any suitable computing device may be used, including, for example, but not limited to a personal computer, laptop computer, phablet, tablet, smart phone, and the like.

In the example of FIG. 2, the central server 220 is coupled to an internal or external data storage unit 232, which may store historical data or time series data, or a combination thereof. It will be appreciated that alternative implementations may use an internal data storage unit, a combination of internal and external data storage units, remote storage units (including cloud-based storage solutions), or any combination thereof.

The system 200 also includes a second remote monitor 250 coupled to the communications network 205. The second remote monitor 250 includes the same constituent components as the first remote monitor 210, but those components are not shown for the sake of clarity. The second remote monitor 250 may be implemented using the same custom-built computing device as described in relation to the first remote monitor 210. Alternatively, the second remote monitor 250 may be implemented using an alternative custom-built computing device or other programmed computing device.

A user accesses the user computing device 240 to communicate with the central server 220 via the network 205. The user registers with an application executing on the central server 220. In one implementation, the central server 220 hosts a website that is accessed by the user utilising a browser application executing on the user computing device 240. In this implementation, the central server presents the user computing device 240 with content to be displayed in the browser on a display device of the user computing device 240. In another implementation, the user downloads the application for execution on the user computing device 240, with the application communicating with the central server 240. In another implementation, a system utilises an Application Programming Interface (API) to a third party provider with which a user computing device interacts. It will be appreciated that a web-based, app-based, or API-based implementation may be equally practised within the context of the present disclosure.

The central server 220 creates a user profile to be associated with the user, with the user providing relevant user information to be stored in the user profile within the customer database 224. In the example of FIG. 2, the user is associated with the first remote monitor 210 and the application grants the user with access privileges sufficient to view and/or modify information pertaining to the first remote monitor 210. Depending on the access privileges, the user is able to utilise the user computing device 240 to access a dashboard for the central server 220 via the browser application or user computing device application, wherein the dashboard optionally enables the user to remotely re-program and/or amend control parameters of the first remote monitor 210 via the central server 220.

The sensor 214 of the remote monitor 210 acquires sensed data over time and stores the sensed data in the data storage module 216. Depending on the implementation, the sensor 214 may acquire sensed data continuously or periodically. An analytics program stored on the data storage module 216 executes on the processor 212 to process the sensed data in order to determine what data to send and when to send that data. In particular, the analytics program processes the sensed data to determine a set of transmission data, derived from the sensed data, to be transmitted from the first remote monitor 210 to the central server 220, by using the transmitter 218. In one implementation, the transmitter 218 is a wireless transmitter, such as a cellular telephony transmitter, Long Range (LoRa) transmitter, or other radio frequency (RF) transmitter.

Processing performed by the analytics program includes processing of historical data in order to identify trends. The analytics program also processes the sensed data for a current time period to identify any extrema points within the sensing data, corresponding to step 115 of FIG. 1. Based on the processing of the historical data and the sensed data for a current time period, the analytics program determines a forecast for at least one characteristic associated with the sensor 214 and subsequently determines the set of transmission data. The forecast may include a trend gradient for each of the characteristics associated with the sensor 214, with each trend gradient associated with a predefined deviation from that trend gradient, wherein the predefined deviation defines a trend envelope for the respective characteristic.

The transmitter 218 transmits the transmission data via the network 205 to the central server 220. The analytics module 226 processes the received transmission data, depending on the application. The next time that the user uses the user computing device 240 to access the application associated with the central server 220, the application presents a dashboard to the user, wherein the dashboard includes information that reflects the received transmission data. Depending on the implementation and user preferences, the dashboard may include numerical data, graphs, colour-coded alerts, or a combination thereof. Thus, a user is able to readily view current sensing data acquired by the sensor 214, as well as existing trends, predicted trends, and the like.

In one arrangement, the application associated with the central server 220 sends a notification to the user computing device 240 whenever an update has been made to data relevant to the user profile. The notification may be, for example, but is not limited to, a Short Message Service (SMS) text message, an email, an in-app notification, or other messaging service.

Computer Implementation

Figure 3:
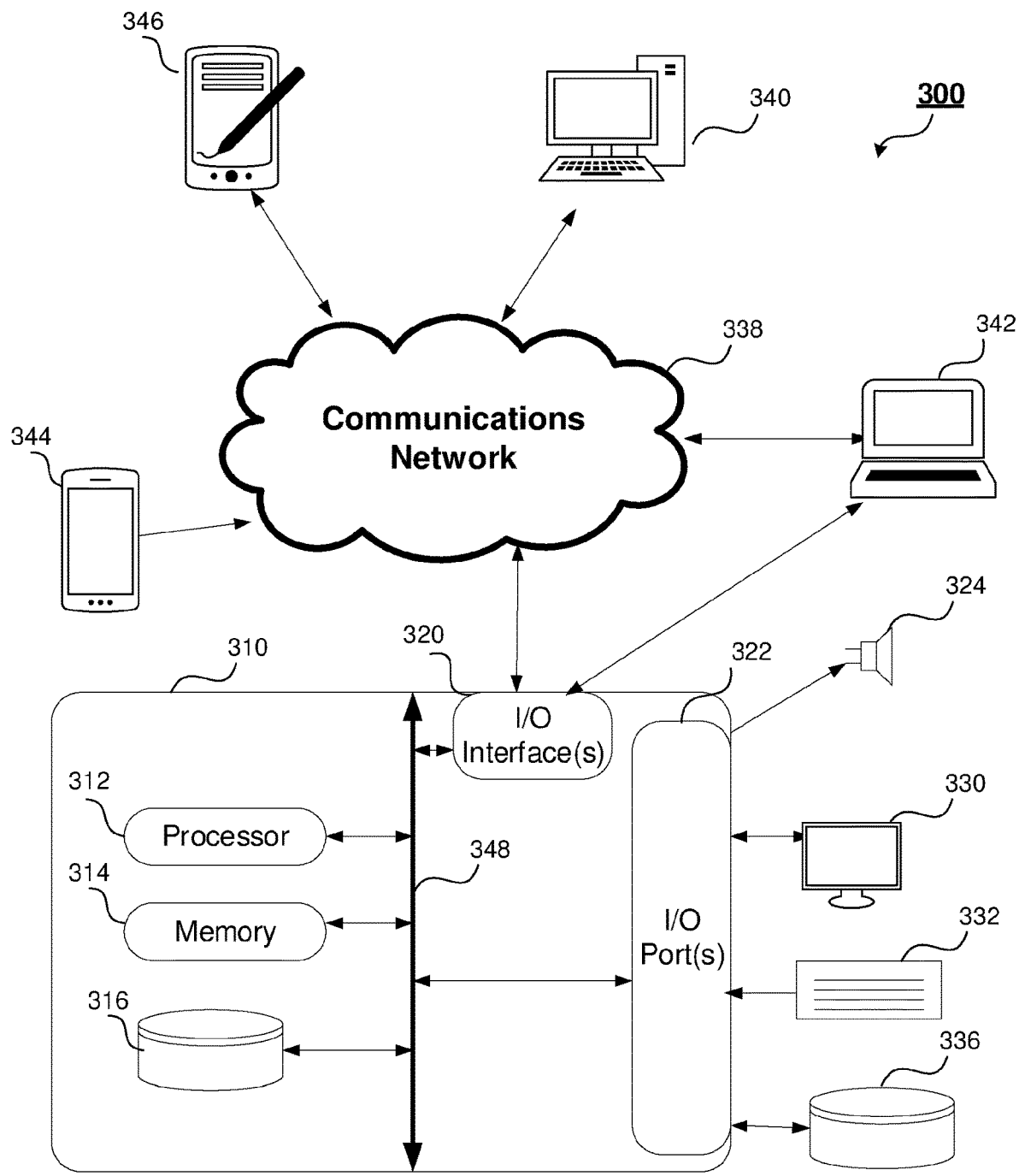
FIG. 3 is a schematic block diagram representation of a system that includes a general purpose computer on which one or more embodiments of the present disclosure may be practised.

The data management and transmission system of the present disclosure may be practised using one or more computing devices, such as a general purpose computer or computer server. FIG. 3 is a schematic block diagram representation of a system 300 that includes a general purpose computer 310. The general purpose computer 310 includes a plurality of components, including: a processor 312, a memory 314, a storage medium 316, input/output (I/O) interfaces 320, and input/output (I/O) ports 322. Components of the general purpose computer 310 generally communicate with each other using one or more buses 348.

The memory 314 may be implemented using Random Access Memory (RAM), Read Only Memory (ROM), or a combination thereof. The storage medium 316 may be implemented as one or more of a hard disk drive, a solid state "flash" drive, an optical disk drive, or other storage means. The storage medium 316 may be utilised to store one or more computer programs, including an operating system, software applications, and data. In one mode of operation, instructions from one or more computer programs stored in the storage medium 316 are loaded into the memory 314 via the bus 348. Instructions loaded into the memory 314 are then made available via the bus 348 or other means for execution by the processor 312 to implement a mode of operation in accordance with the executed instructions.

One or more peripheral devices may be coupled to the general purpose computer 310 via the I/O ports 322. In the example of FIG. 3, the general purpose computer 310 is coupled to each of a speaker 324, a display device 330, an input device 332, and an external storage medium 336. The speaker 324 may be implemented using one or more speakers, internal to the computing device 310 or external to the computing device 310, such as in a stereo or surround sound system. In the example in which the general purpose computer 310 is utilised to implement a remote monitor in accordance with FIG. 2, one or more peripheral devices may relate to a sensor or transmitter connected to the I/O ports 322.

The display device 330 may be a computer monitor, such as a cathode ray tube screen, plasma screen, or liquid crystal display (LCD) screen. The display 330 may receive information from the computer 310 in a conventional manner, wherein the information is presented on the display device 330 for viewing by a user. The display device 330 may optionally be implemented using a touch screen to enable a user to provide input to the general purpose computer 310. The touch screen may be, for example, a capacitive touch screen, a resistive touchscreen, a surface acoustic wave touchscreen, or the like.

The input device 332 may be a keyboard, a mouse, a stylus, drawing tablet, or any combination thereof, for receiving input from a user. The external storage medium 336 may include an external hard disk drive (HDD), an optical drive, a floppy disk drive, a flash drive, solid state drive (SSD), or any combination thereof and may be implemented as a single instance or multiple instances of any one or more of those devices. For example, the external storage medium 336 may be implemented as an array of hard disk drives.

The I/O interfaces 320 facilitate the exchange of information between the general purpose computing device 310 and other computing devices. The I/O interfaces may be implemented using an internal or external modem, an Ethernet connection, or the like, to enable coupling to a transmission medium. In the example of FIG. 3, the I/O interfaces 322 are coupled to a communications network 338 and directly to a computing device 342. The computing device 342 is shown as a personal computer, but may be equally be practised using a smartphone, laptop, or a tablet device. Direct communication between the general purpose computer 310 and the computing device 342 may be implemented using a wireless or wired transmission link.

The communications network 338 may be implemented using one or more wired or wireless transmission links and may include, for example, a dedicated communications link, a local area network (LAN), a wide area network (WAN), the Internet, a telecommunications network, or any combination thereof. A telecommunications network may include, but is not limited to, a telephony network, such as a Public Switch Telephony Network (PSTN), a mobile telephone cellular network, a short message service (SMS) network, or any combination thereof. The general purpose computer 310 is able to communicate via the communications network 338 to other computing devices connected to the communications network 338, such as the mobile telephone handset 344, the touchscreen smartphone 346, the personal computer 340, and the computing device 342.

One or more instances of the general purpose computer 310 may be utilised to implement a server acting as a data centre to implement a data management and transmission system in accordance with the present disclosure. For example, the first remote monitor 210, the second remote monitor 250, and the central server 220 of FIG. 2 may be implemented using one or more instances of the general purpose computer 310. In such embodiments, the memory 314 and storage 316 are utilised to store data relating to historical data, user data, and user interface templates. Software for implementing the data management and transmission system is stored in one or both of the memory 314 and storage 316 for execution on the processor 312 to produce a customised remote monitor or an improved and customised server in accordance with the present disclosure. The software includes computer program code for implementing method steps in accordance with the method of data management and transmission described herein.

One application for an embodiment of the system of the present disclosure is in relation to transmission of data via a transmission medium that is limited in bandwidth, expensive, or a combination thereof. One example of such a transmission medium is a satellite communications link. In many rural environments, there are no terrestrial communications networks and the only way by which to transmit data is via satellite. While communication by satellite is relatively reliable, the cost of transmitting data via a satellite channel is typically significantly more than an equivalent optical fibre or cellular channel. The bandwidth of a satellite communication link is often much less than a terrestrial link, such as an optical fibre link. Consequently, many satellite service providers charge for data transmission by the packet, with packets typically in the range of 8 to 128 bytes. Further, transmitting data by satellite requires transmitters that are considerably more powerful than transmitters used to couple to local wired or wireless networks. Such power use is of particular concern for battery-powered devices, such as IoT devices and the like.

Remote Monitoring of Fluid Level Example

Figure 4:
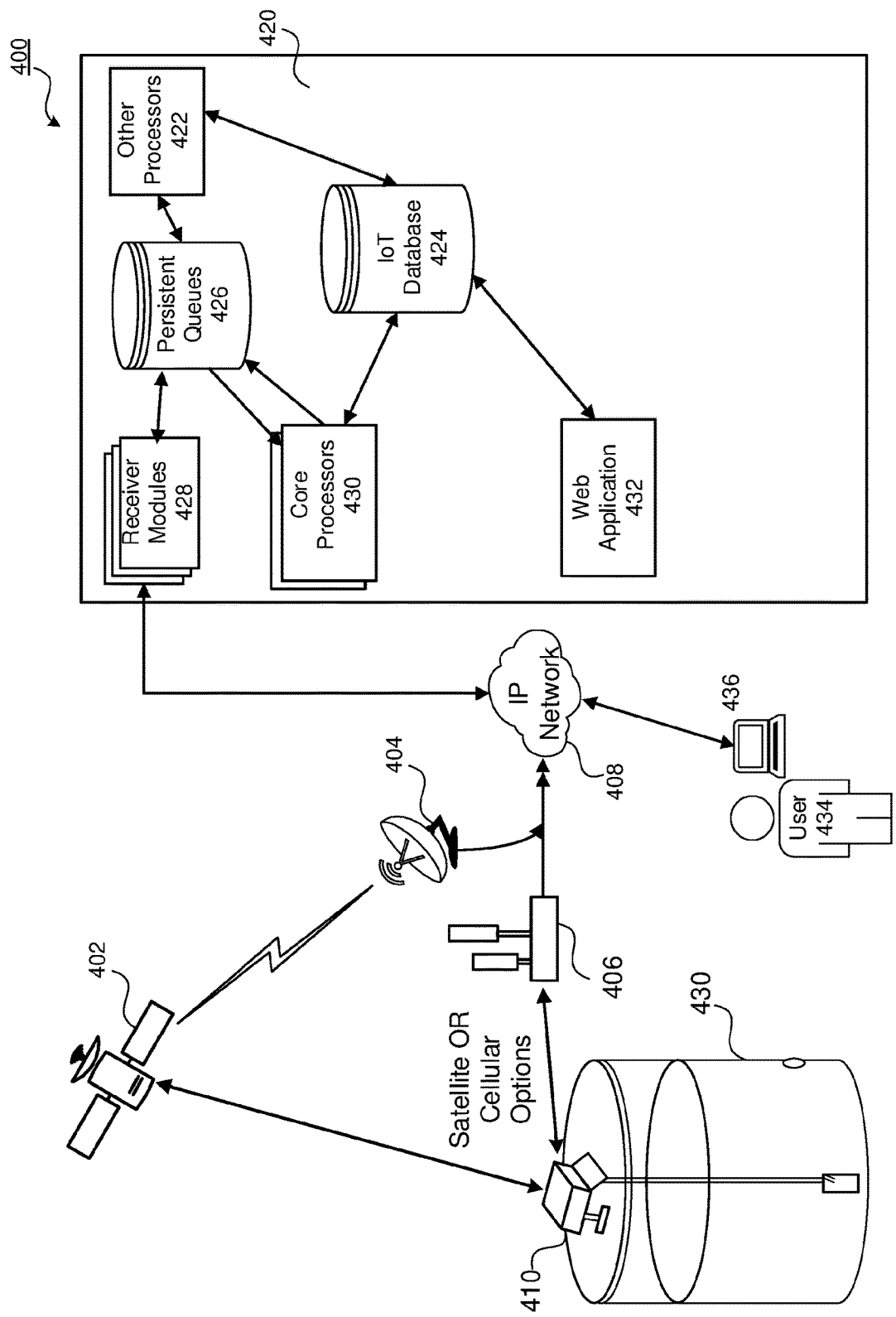
FIG. 4 is a schematic representation of a system on which one or more embodiments of the present disclosure may be practised.

FIG. 4 is a schematic block diagram representation of a system 400 relating to remote monitoring of a fluid level, such as water level in a water reticulation system. The system 400 performs trend analysis and incorporates forecasting mechanisms to send as little data as necessary as often as required to deliver the majority of value to an end user at an acceptable transmission cost.

The end user would benefit significantly by having an accurate history of water level that includes all key movements (for better understanding of supply, demand and system performance) and a forecast of the current level within an acceptable margin. This would lead to better overall management and allocation of resources.

The system 400 includes a remote monitor 410 that is configured with a sensor (not shown) for monitoring a fluid level in a reservoir 430. The remote monitor 410 is implemented using a programmable computing device, such as a general purpose computer, custom-built computer, programmable logic controller (PLC), or the like. For example, the remote monitor 410 may be implemented using a custom-built computing device as described above with reference to the first remote monitor 210 of FIG. 2. The remote monitor 410 includes a transmitter for transmitting transmission data to a central server, represented in the system 400 as a cloud-based data centre 420. Depending on the use case, the remote monitor 410 may be a single standalone unit or may form part of a network of remote monitors.

Depending on the application, the transmitter may be implemented in different ways. In the example of FIG. 4, the transmitter may be a satellite transmitter for transmitting data via a satellite 402 to a satellite base station 404 and then, via a communications network 408, to the data centre 420. The satellite communication may be offered by Globalstar Satellite, for example. The example of FIG. 4 also shows an alternative implementation, in which the transmitter is a cellular telephony transmitter that is adapted to communicate with a cellular base station 406 and then, via the communications network 408, to the data centre 420. The transmitter may be a dedicated transmitter or a combination of transmitters. For example, in FIG. 4, the transmitter of the remote computing device 402 may be a satellite transmitter, a cellular telephony transmitter, or a combination thereof. Other transmitters may equally be practised to enable transmission of data from the remote monitor 410 to the data centre 420, including, but not limited to, WiFi, Bluetooth, LoRa, and the like.

The remote monitor 410 monitors a fluid level in the reservoir 430. The sensor in the remote monitor 410 regularly samples the level of fluid in the reservoir 430 and software executing on the remote monitor 410 identifies from the sampled levels when a current level is outside an acceptable range of a predefined trend OR when a maximum time between samples has elapsed. The remote monitor 410 calculates a new trend envelope based on a new trend gradient derived from a set of one or more of the most recently received sample levels.

In one arrangement, the remote monitor 410 stores sampled data acquired over a preceding time period, such as 5 days, a working week, or a month, for example. The remote monitor 410 calculates a new trend envelope from a set of data sampled during the current time period. In one implementation, the remote monitor 410 determines a forecast trend, based on a gradient determined from the set of data sampled during the current time period and a most recently sampled data point. The trend envelope is defined by the gradient and an acceptable width (i.e., predefined deviation) either side of the gradient. Depending on the implementation, the acceptable width is a system defined parameter, a user defined parameter, or defined by a machine learning algorithm. In one implementation, the remote monitor 410 determines the acceptable width as a predefined standard deviation of the calculated trend line.

One or more arrangements include a mechanism (e.g., a software application, subroutine, or the like executing on a processor of the remote monitor 410) to identify if there is a new trend emerging in the last few data points or alternatively determine if the overall dataset (since last transmission) is indicative of an existing trend. This mechanism looks to see if there is a consistent deviation of the latest data points away from the overall trend. In this case, the main trend is discarded and replaced by the trend determined by analysis of the most recent deviation points. The mechanism tries a number of trend scenarios focusing on subsets of the most recent data points to determine which trend scenario has the most consistent trend. Determination of which trend scenario has the most consistent trend may be performed using heuristics, including a best fit approach as known in the art.

One arrangement includes a trigger mechanism that analyses a set of trigger parameters to determine when data is to be transmitted. Such trigger parameters may include, for example:
- if a current sampled data point is outside the trend envelope;
- if there is excessive signal noise around an overall steady trend line that can be ignored until a maximum transmission interval has been reached or a more significant deviation occurs—in this case the normal envelope may be breached regularly over the period but the transmission trigger ignored; and
- if a maximum transmission interval period has been reached.

In order to minimise any sensor noise or jitter that may occur during sampling of a water level, one arrangement implements a data sampling mechanism that averages sample data over a shortened sampling period.

One or more embodiments invoke input sample data compression by removing repetitious data points, in order to ensure that there is no excessive repetition of stored data points, thus optimising use of available data storage on the remote computing device 410.

The remote monitor 410 calculates a set of the most important extrema since a preceding data transmission. The set of most important extrema may include a predefined number of extrema, wherein the predefined number may be set based on a transmission packet size and the available room in the packet for extrema data. Alternatively, only extrema having predefined parameters or characteristics are included in the set of most important extrema. A data packet, corresponding to the transmission data packet 1200 of FIG. 12, has a particular predefined size that allows for the transmission of the current data point plus a number of historical points, as well as the gradient. The number of historical points may be, for example, a set of history points for a preceding time period, wherein those history points are the most important extrema for that time period. The data packet can also accommodate In the Zone (ITZ) data, which is data in a zone of repetitious oscillation around a steady level (trend and envelope), as well as a flag that identifies that this mode is active.

The remote monitor 410 is configured to send data to the data centre 420 whenever a sampled level (i.e., a data point representing a sensed value for the water level in the water reticulation system, in this example) is outside an existing trend. This ensures that the data centre is informed in near real-time of all instances in which a newly sampled level is outside an expected range. The remote monitor 410 transmits new trend data, as well as any periodic housekeeping data that might be required. Such housekeeping data may relate, for example, to operating parameters of the remote monitor 410 itself, or other sensed environmental parameters, such as temperature, humidity, barometric pressure, GPS co-ordinates, and the like.

One or more embodiments utilise a mechanism to remove minor extrema and/or inflexions that may result from temperature changes or other minor sensor aberrations and which do not truly reflect statistically significant changes in water level.

The reservoir 430 may form part of a larger water reticulation system for distributing water. Over time, the level of water in the reservoir 430 may oscillate between acceptable limits as water flows in and out of the reservoir 430. The remote monitor 410 manages transmission of data to the data centre in order to minimise data transmission charges, as well as limiting drain on power reserves of the remote monitor 410, whilst also providing effective response times such that the data centre 420 is aware of any meaningful changes in fluid levels within an appropriate timeframe.

Configuring the remote monitor 410 to transmit data only when a sampled level exceeds a predefined range or when a predefined time period has elapsed reduces the frequency of transmission to a minimum while ensuring responsiveness to important level changes. Depending on the application, the remote monitor 410 is configurable with a range of parameters to ensure the system responds appropriately to reticulation systems with different trend variations. In various implementations, the parameter values may be varied or set by an installer, an operator of the data centre 420, an end user (via a dashboard provided by the data centre 420), or any combination thereof.

One or more arrangements include a deferred transmission mechanism to analyse packet history to identify repetitious cycling that may be temporarily ignored to remove excessive data transmission due to constant breaching of the standard envelope. This process:
- calculates the number of maximum (major) extrema over a preceding time period (e.g., the past 2-4 days);
- calculates an overall trend of the entire data set and a maximum deviation above and below the trend line; and
- based on these, calculates an envelope that encompasses the cycling variations.

If there are multiple major cycles within each day and there is an acceptable margin between the bottom of the envelope and what is considered a dangerously low level of liquid that is being monitored, then these values may temporarily replace the standard trend (gradient) and envelope—this is known as being in a repetitious noise zone, referred to herein as being "In The Zone" (ITZ). That is, ITZ is a zone of repetitious oscillation around a steady level.

If ultrasonic sensors are used to assess the liquid level, then there is an additional mechanism to determine what is the likely zero level on the liquid store. This is necessary to ensure that the ITZ envelope is not used when the level is too close to zero.

One or more arrangements optionally include a transmission plan and retry schedule that ensures a high likelihood of delivery. Such transmission plans and retry schedules seek to cater for errors or latency in a communications link, such as a satellite transmission, by providing strategies to ensure a high likelihood or data transmission success.

The data centre 420 includes a receiver 428 for receiving data transmitted from the remote monitor 410. In the example of FIG. 4, the receiver 428 is coupled to the network 408, which corresponds to the communications network 205 of FIG. 2 and may include a local area network (LAN), a wide area network (WAN), a telecommunications network, or any combination thereof.

In the example of FIG. 4, the receiver 428 is implemented using one or more communication specific receiver modules that are configured to perform timestamp and queuing operations for data received by the data centre 420. The receiver 428 receives data transmitted from the remote computing device 410 and stores all received data points in a time series format, along with any trend/gradient and envelope data received from the remote computing device.

The data centre 420 also optionally includes a database 426 of persistent queues. The database 426 of persistent queues may be utilised to buffer incoming transmission packets for processing.

The data centre 420 further includes a set of one or more core processors 430 that are adapted to execute an application to implement functionality for the data centre 420. Such functionality includes receiving, decoding, and processing received data transmissions, persistence, generation of alerts, analytics, generation of events, and event servicing. In particular, the core processors 430 may perform one or more of: decoding incoming packets based on type; persisting all data points received in each data packet; displaying a current forecast level based on latest data and trend; if certain noise suppression modes are active, displays an average forecast level that is replaced once next actual data is successfully received; initiates and controls alerts, other processing and analytics, based on user and system definable parameters. The core processors 430 ensure that a forecast of the current water level displayed numerically and/or graphically by the data centre 420 is within a predefined margin of the actual water level. The predefined margin may be system defined or user configurable. Once an actual level arrives in a received data packet from the remote monitor 410, the actual level replaces the forecast level. The set of processors 430 is coupled to a database 424 for storing client data and received time series data.

Depending on the implementation, the data centre 420 optionally includes further functionality embodied as module 422. Such functionality may include, for example, but is not limited to, extra processors, an Application Programming Interface (API), a notification system, such as SMS or email server, and the like.

The data centre 420 provides an interface in the form of a dashboard that may be accessed by an authorised user 434 to view data derived from the remote monitor 410. In this example, the data centre 420 includes a web application 432 that hosts and implements the user dashboard, as well as performing back office management, provisioning management, modifying analytics parameters, and handling other user interactions. Such other user interactions include enabling the user to view and/or modify one or more parameters associated with the remote monitor 410 and data sampled by the remote computing device 210. This enables the user to change sampling and reporting periods, as well as to change an acceptable range of values around any given trend at any time.

In a web-based implementation, the user 434 utilises a user computing device 436 to communicate with the web application 432 via the network 408 and the communications receiver 428. In an app-based implementation, an application executing on the user computing device 436 communicates with the web application 432 via the network 408 and the communications receiver 428. The user computing device 436 may be implemented using a personal computer, laptop, tablet computing device, phablet computing device, smartphone, or other suitable computing device equipped to couple to the communications network 408.

The dashboard provides a graphical user interface for displaying monitored data to the user. In one arrangement, the dashboard plots all data points received from the monitor on a graph, along with one or more trend/gradient lines. One arrangement plots a trend/gradient line from the point of the most recently received sample data to the current time. This section of the representation is within "envelope cm" of the current actual liquid level. That is, the graph shows a trend gradient and an acceptable upper and lower bound around that trend gradient, wherein the upper and lower bounds define a trend envelope that forecasts levels to be within a predefined range of the forecast trend gradient, with the range being defined in centimetres for the case in which the data points relate to a water level in a reservoir.

In the event that the "ITZ" condition is active, then the plot from the last received data line trends down towards the average trend sent over a period representing the maximum packet send interval.

The dashboard optionally displays the envelope width on the forecast section of the graph. When the data centre 420 receives a next packet transmitted from the remote monitor 410, the data centre plots data received in the next packet on the graph, replacing the forecast with actual data points.

There can be various delays and latency resulting from propagation of data packets from the remote monitor 410 to the data centre 420. One arrangement of the data centre 420 optionally includes protections that prevent or minimise invalid displays. One implementation, for example, ensures that a forecast level can never be higher than a predefined maximum value specified for the reservoir or tank that is being monitored. Further, a forecast level can never be lower than zero.

Figure 11A:
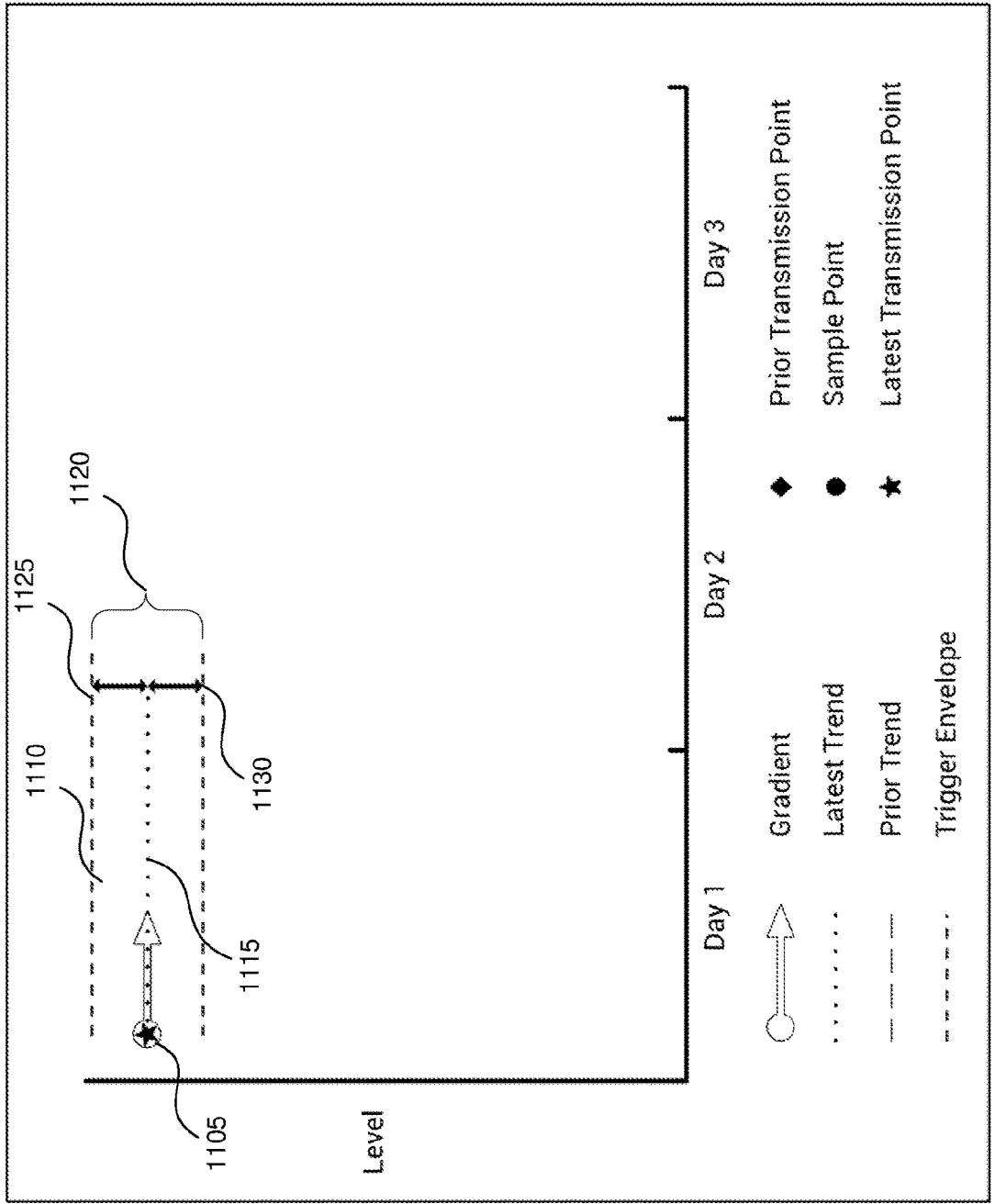
FIGS. 11A-E are graphs illustrating processing of received data points to define a trend envelope based on a trend gradient.

FIG. 11A is a graph illustrating data captured by a remote monitor, such as the remote monitor 210 from FIG. 2. In this example, the remote monitor includes a sensor that captures an initial data point 1105 at the beginning of Day 1, wherein the initial data point 1105 relates to a characteristic being a sensed value of a level of fluid in a reservoir. An application executing on the remote monitor determines an initial trend envelope 1110 that includes a trend gradient 1115 and a window 1120 surrounding the trend gradient 1115. In this example, the window 1120 is a predefined distance above and below the trend gradient 1115, such that an upper bound 1125 of the window 1120 is equidistant from the trend gradient 1115 as a lower bound 1130 of the trend gradient. The application projects that the level of fluid in the reservoir will remain steady and thus the trend gradient 1115 has a value of 0, represented as a horizontal line.

In an alternative embodiment, the application may be programmed with an initial trend gradient. The initial trend gradient may be based, for example, on historical data, normative data associated with the environment in which the remote sensor is functioning, or even a user-defined value.

Figure 11B:
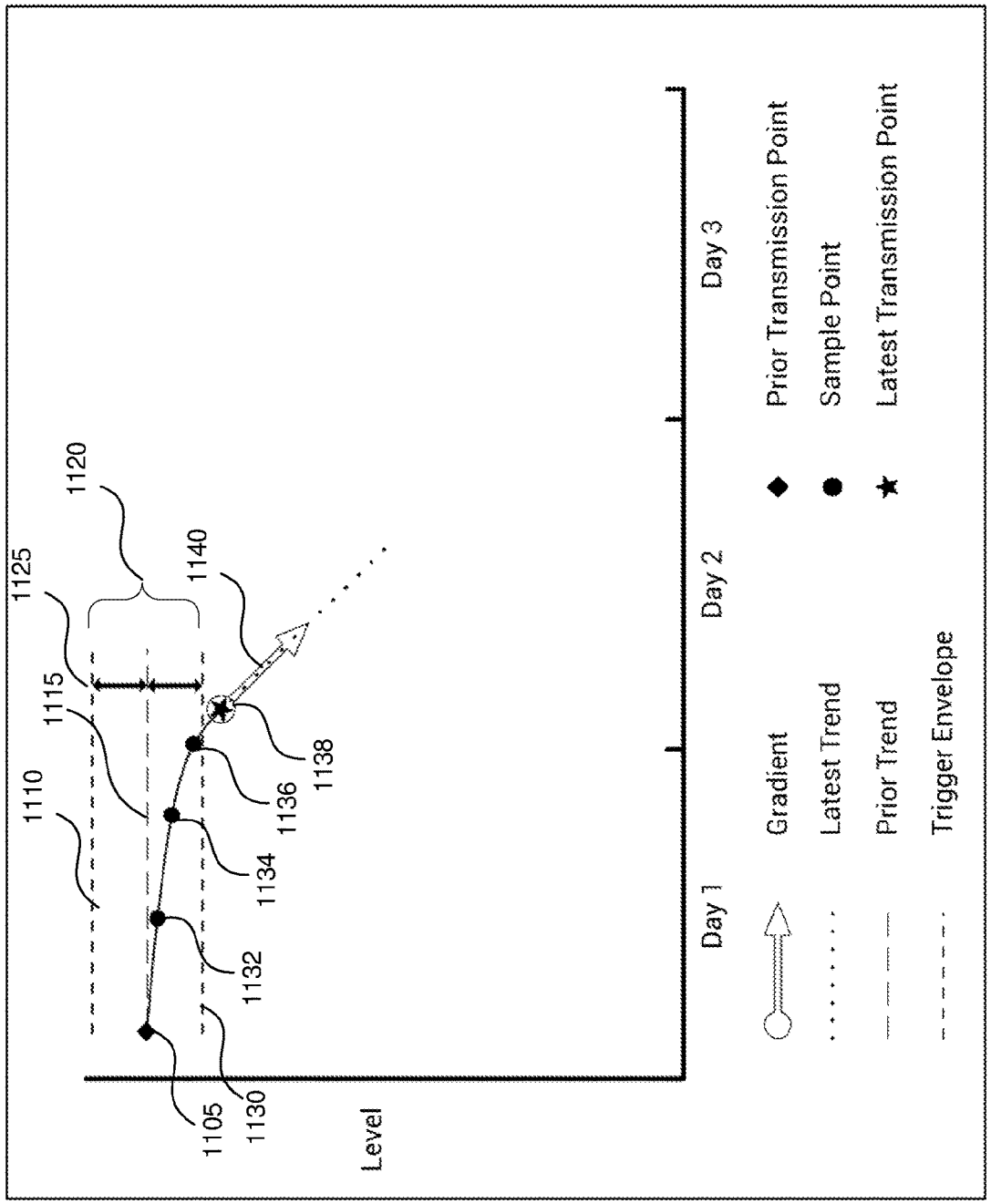

FIG. 11B is a graph showing data points captured by the remote sensor of FIG. 11A, at a first point 1138 captured during Day 2. The data points include the initial data point 1105, along with subsequent data points 1132, 1134, 1136, 1138 captured by the remote monitor at periodic intervals. Each of data points 1132, 1134, 1136 falls within the trend envelope 1110 defined by upper and lower bounds 1125, 1130. Data point 1138 is outside the trend envelope 1110.

The application identifies that data point 1138 is outside the trend envelope 1110 and makes a determination to transmit data point 1138 from the remote sensor to a central server. Transmission of the data point 1138, being outside the current trend envelope 1110, may occur in an event data packet. When the application identifies a data point outside a current trend envelope, the application calculates a new forecast trend envelope based on a forecast gradient and associated upper and lower bounds. Calculation of the new forecast gradient is based on a current data point and a set of preceding data points. In the example of FIG. 11B, the new forecast trend gradient is shown as a downward arrow 1140.

Figure 11C:
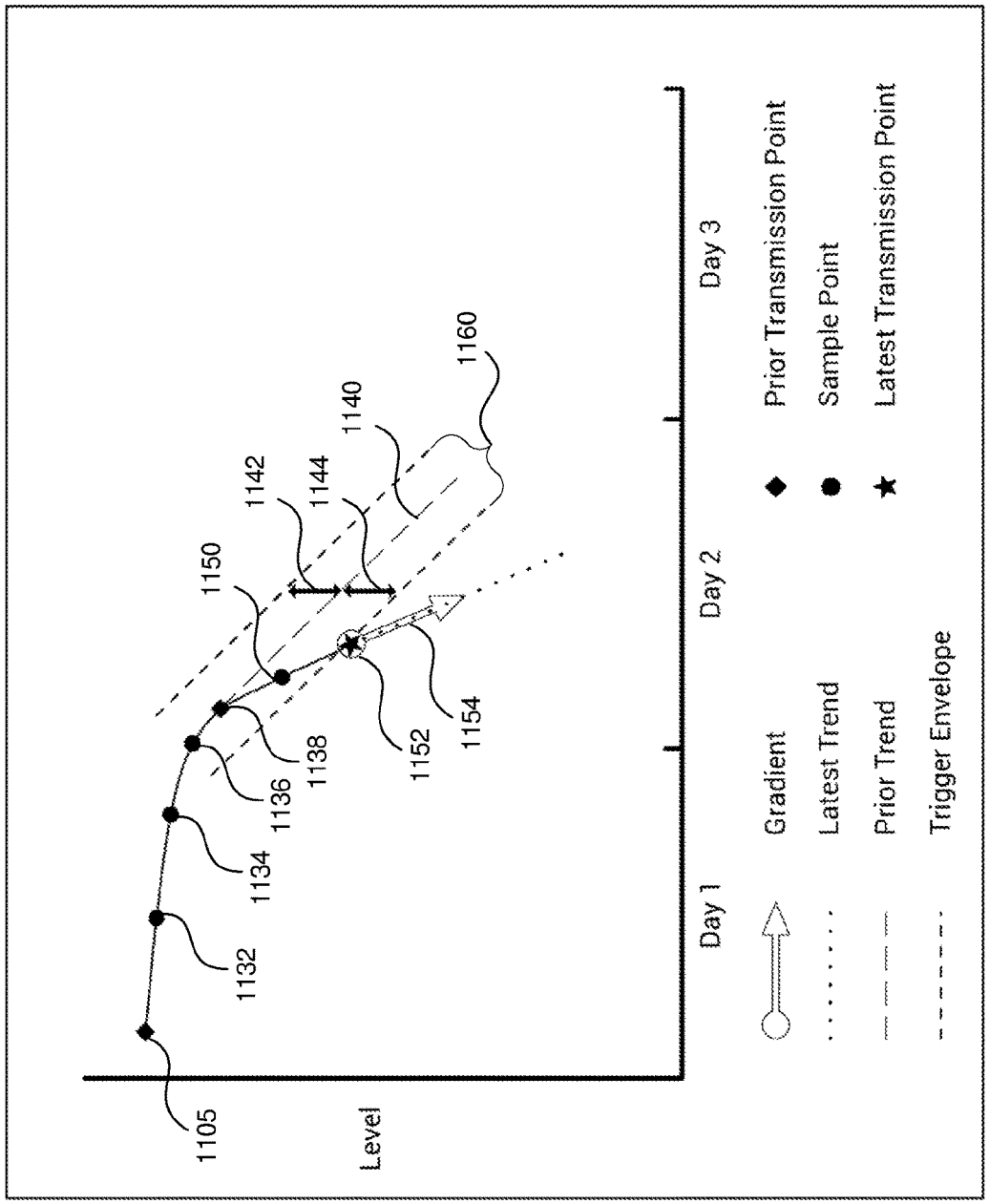

FIG. 11C is a graph showing data points captured by the remote sensor of FIG. 11A, at a third point 1152 captured during Day 2. The data points shown in the graph include points 1105, 1132, 1134, 1136, and 1138 from FIGS. 11A and 11B, along with new points 1150 and 1152.

In the graph of FIG. 11C, the trend gradient 1140 is associated with an upper bound 1142 and a lower bound 1142, defining a second trend envelope 1160. Point 1150 is within the second trend envelope 1160. However, point 1152 is outside the trend envelope 1160, falling below the lower bound 1142.

As point 1152 falls outside the second trend envelope 1160, which is the active trend envelope at the time that point 1152 is received, the application decides to transmit data point 1152 as a point of interest back to the central server, along with selected preceding extrema from a given time period. Depending on the use case, the application may send points that are strictly outside the active trend envelope. Alternatively, the application may send points that fall on the upper bound or lower bound, or beyond the upper bound or lower bound.

Once the application determines that point 1152 is outside the active trend envelope, which in this case is second trend envelope 1160, the application calculates a new trend gradient and an associated new trend envelope. In the example of FIG. 11C, the application determines a new trend gradient 1154, having a steeper negative gradient than the previously determined trend gradient 1140. The new trend gradient forms the basis of a new active trend envelope.

Figure 11D:
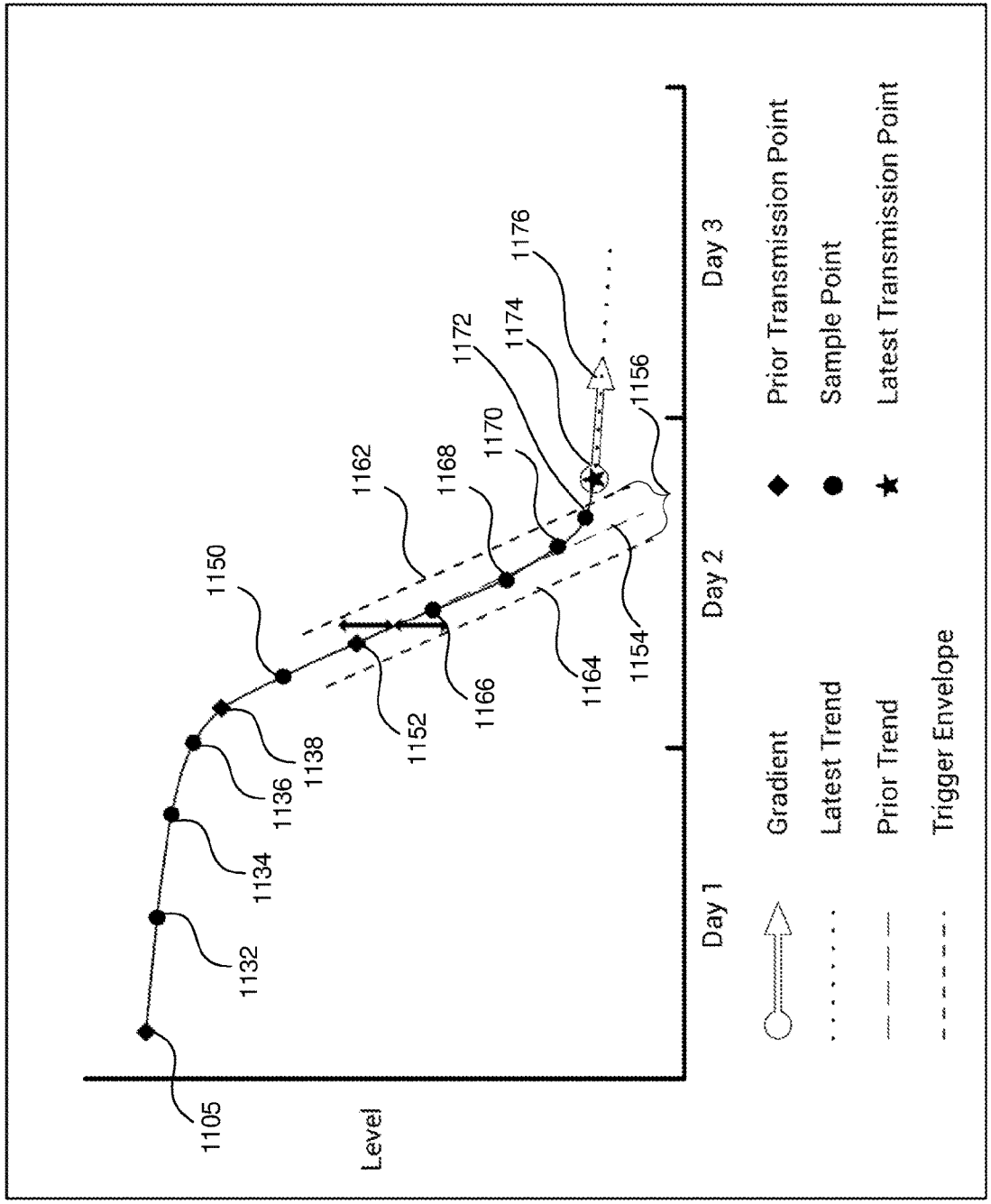

FIG. 11D is a graph showing data points captured by the remote sensor of FIG. 11A, up to a later point in time of Day 2. In particular, FIG. 11D shows the points 1105, 1132, 1134, 1138, 1150, and 1152 shown in FIG. 11C, along with new points 1166, 1168, 1170, 1172, and 1174. As noted in relation to FIG. 11C, the application determined a new trend gradient 1154 on the basis of point 1152 lying outside the then active trend envelope 1160. FIG. 11D shows a new active trend envelope 1156 defined by the trend gradient 1154 and a new upper bound 1162 and new lower bound 1164.

Points 1166, 1168, 1170, and 1172 lie within the new active trend envelope 1156, so there is no need to transmit those data points to the central server, as those data points fall within the active trend envelope and are thus within a forecast range of expected values. In some implementations, the application executing on the remote sensor sends not only data points that are outside an active trend envelope, but also a next data point that follows a predefined period of time since a most recent transmission. This ensures that a predefined maximum period of time exists between transmissions of data points.

Point 1174 lies outside the active trend envelope 1156, in this case lying outside the upper bound 1162. The application identifies that point 1174 lies outside the active trend envelope and marks data point 1174 for transmission to the central server. The application then determines a new trend gradient 1176, which will form the basis of a new active trend envelope for received data points going forward.

Figure 11E:
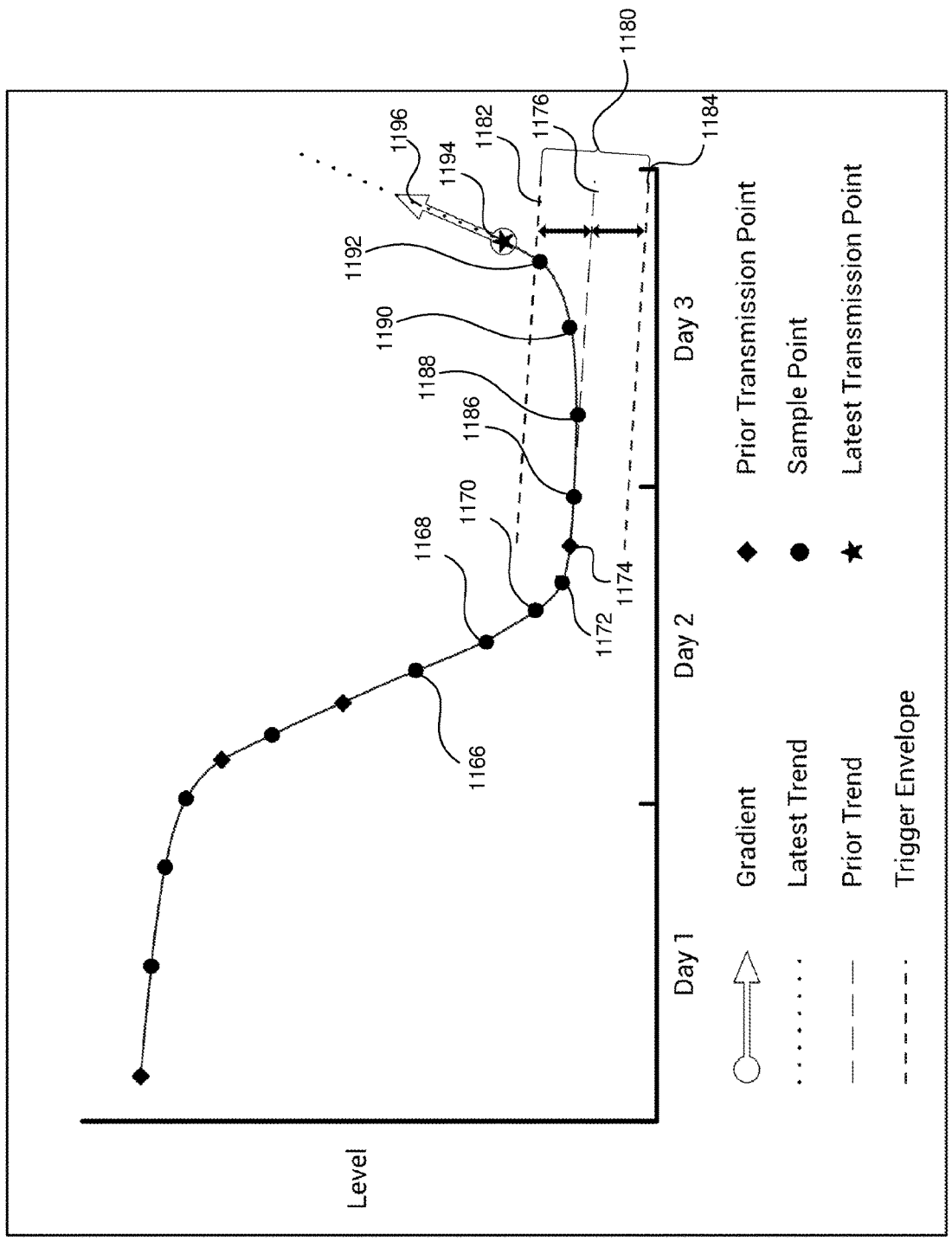

FIG. 11E is a graph showing further data points captured by the remote sensor of FIG. 11A through to Day 3. FIG. 11E shows a new active trend envelope 1180 defined by an upper bound 1182 and a lower bound 1184, either side of the trend gradient 1176. FIG. 11E shows newer points 1186, 1188, 1190, 1192, and 1194. Points 1186, 1188, 1190 and 1192 are within the active trend envelope 1180. The latest received data point, point 1194, is outside the active trend envelope 1180, being above the upper bound 1182. Accordingly, the application executing on the remote sensor identifies point 1194 for transmission to the central server. The application also determines a new trend gradient 1196, based on point 1194.

As described above, different implementations may also transmit data points once a predefined period of time has elapsed since the most recent transmission. Such data transmissions may be referred to as timeout data packets.

Calculate New Trend

Figure 5:
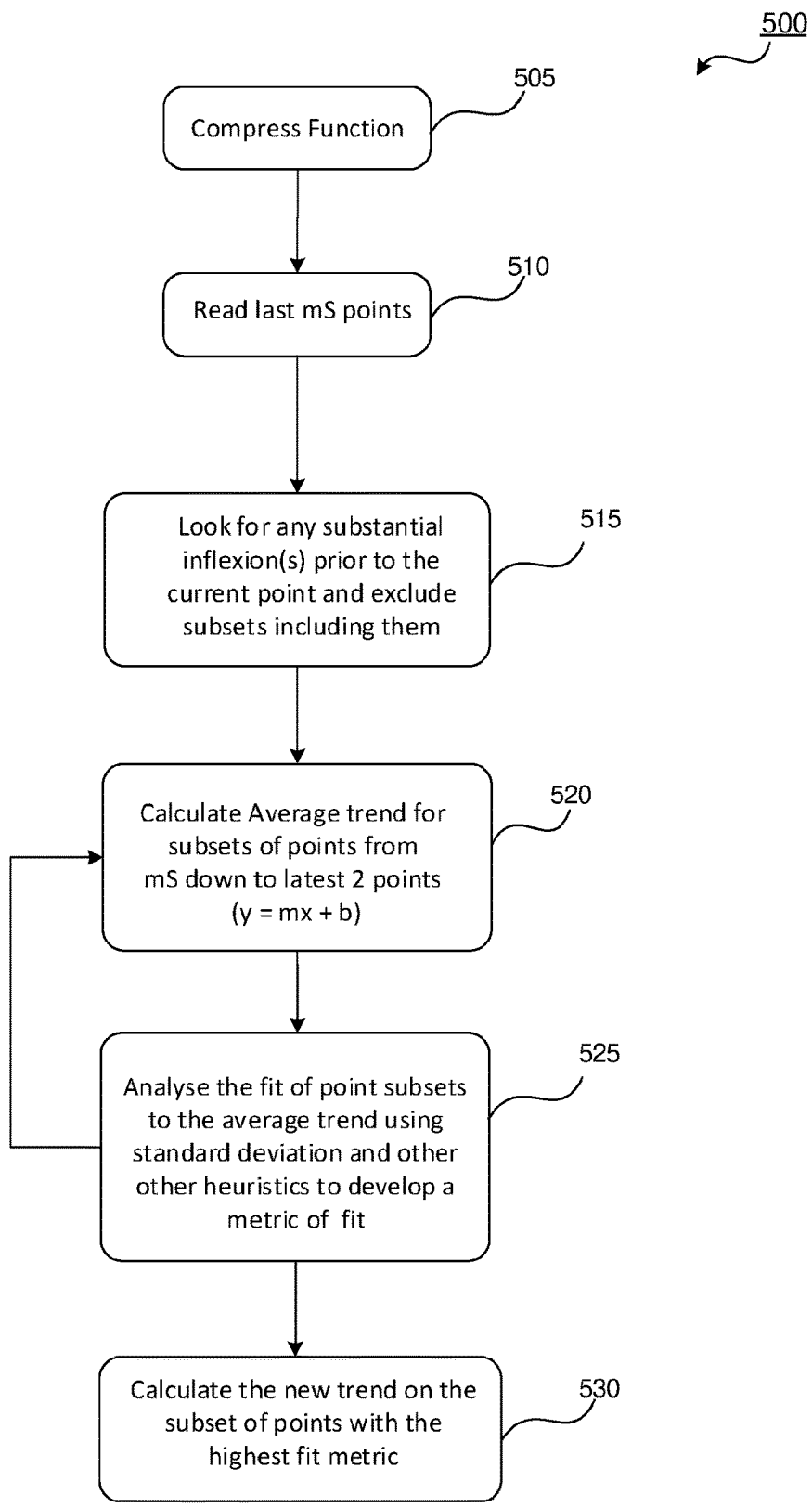
FIG. 5 is a flow diagram of a method for calculating a new trend.

FIG. 5 is a flow diagram of a method 500 for calculating a new trend. The method reads all stored sample data acquired since a preceding data transmission and determines what the most likely trend is likely to be, looking forward. The method 500 starts at step 505 by running a compress function. The compress function removes noise and other jitter that might be present in a set of received data points. That is, the compress function removes data points that add no additional information to the data samples. For example, if a set of received data points provides a flat line, the compress function may reduce the number of data points to two or three data points within a prescribed time period, which are sufficient to establish the trend for that time period.

Control passes from step 505 to step 510, which reads from storage the last mS number of sampled data points, where mS is the minimum number of points required to determine a trend. mS stands for "m" samples and is determined empirically.

In step 515, the method looks for any substantial extrema points prior to the current point and excludes subsets that include those extrema points. In step 520, the method calculates the average trend for subsets of points from mS down to the latest 2 points. Control passes to step 525, which analyses the fit of point subsets to the average trend using standard deviation and other heuristics to develop a metric of fit. Control returns to step 520 and steps 520 and 525 reiterate. In one implementation, the number of iterations is in the range of 2 to 20 cycles. In one example, the number of iterations is 8 cycles.

Step 530 then calculates the new trend on the subset of points with the highest fit metric.

Identify Major Extrema

Figure 6:
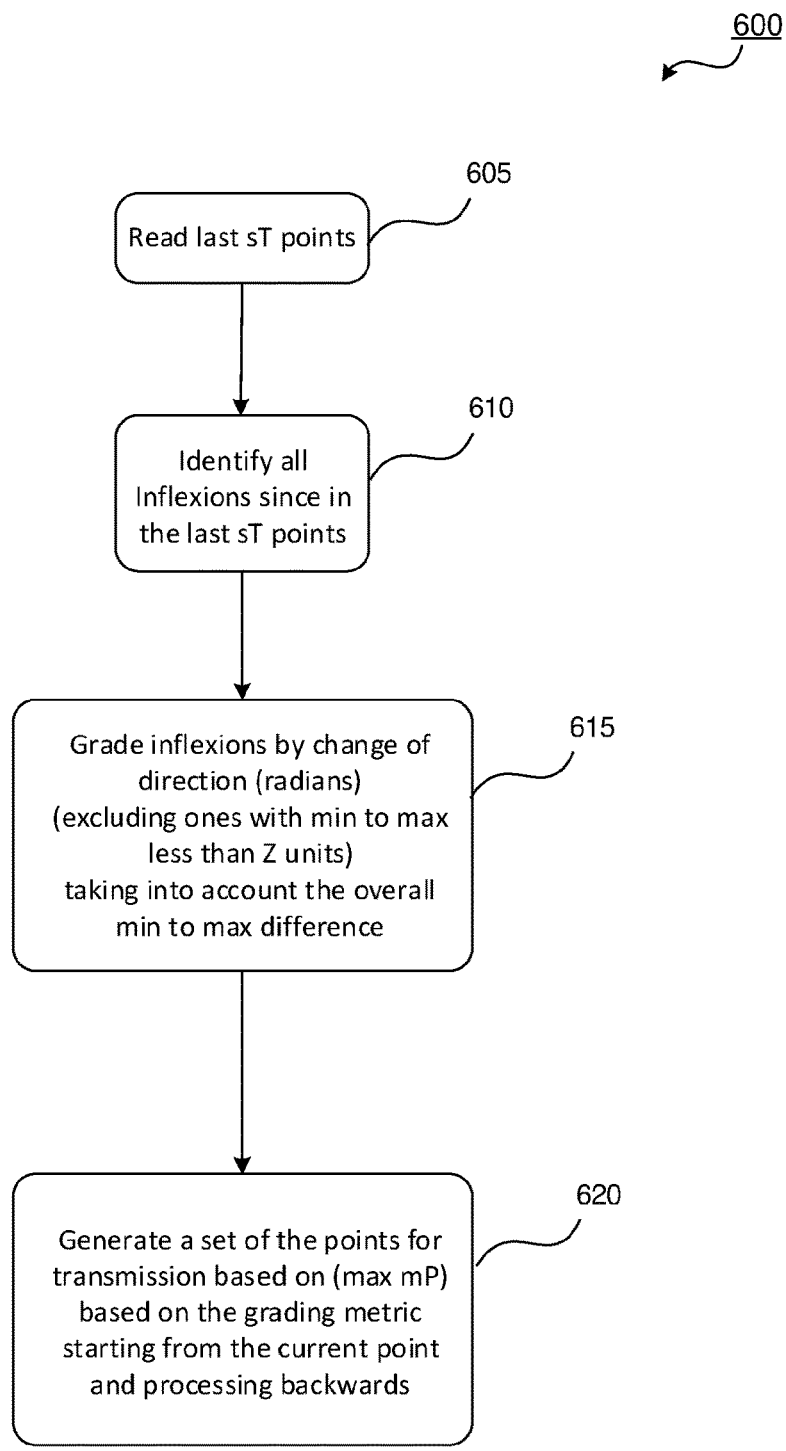
FIG. 6 is a flow diagram of a method for identifying major extrema.

FIG. 6 is a flow diagram of a method 600 for identifying major extrema, corresponding to step 515 of FIG. 5. The maximum number of points that can be sent in a single transmission depends on a number of factors, including the mode of communications and any need to transmit other data within the same transmission package. The method 600 begins at step 605, which reads the last sT points, where sT is the number of samples since the last preceding transmission. Step 610 identifies all extrema that have occurred in the last sT points.

Step 615 grades the extrema based on the change of direction, taking into account the overall minimum to maximum difference. In this example, the change of direction is determined in radians and extrema having a magnitude of less than a predefined "Z" unit are discounted (Z is the minimum reference unit (e.g., cm)). Step 620 then generates a set of points for transmission based on the maximum number of level points to be sent in a single transmission "mP", and further based on the grading metric applied in step 615 and applied from the current point and processing backwards in time.

Compression Function

Figure 7:
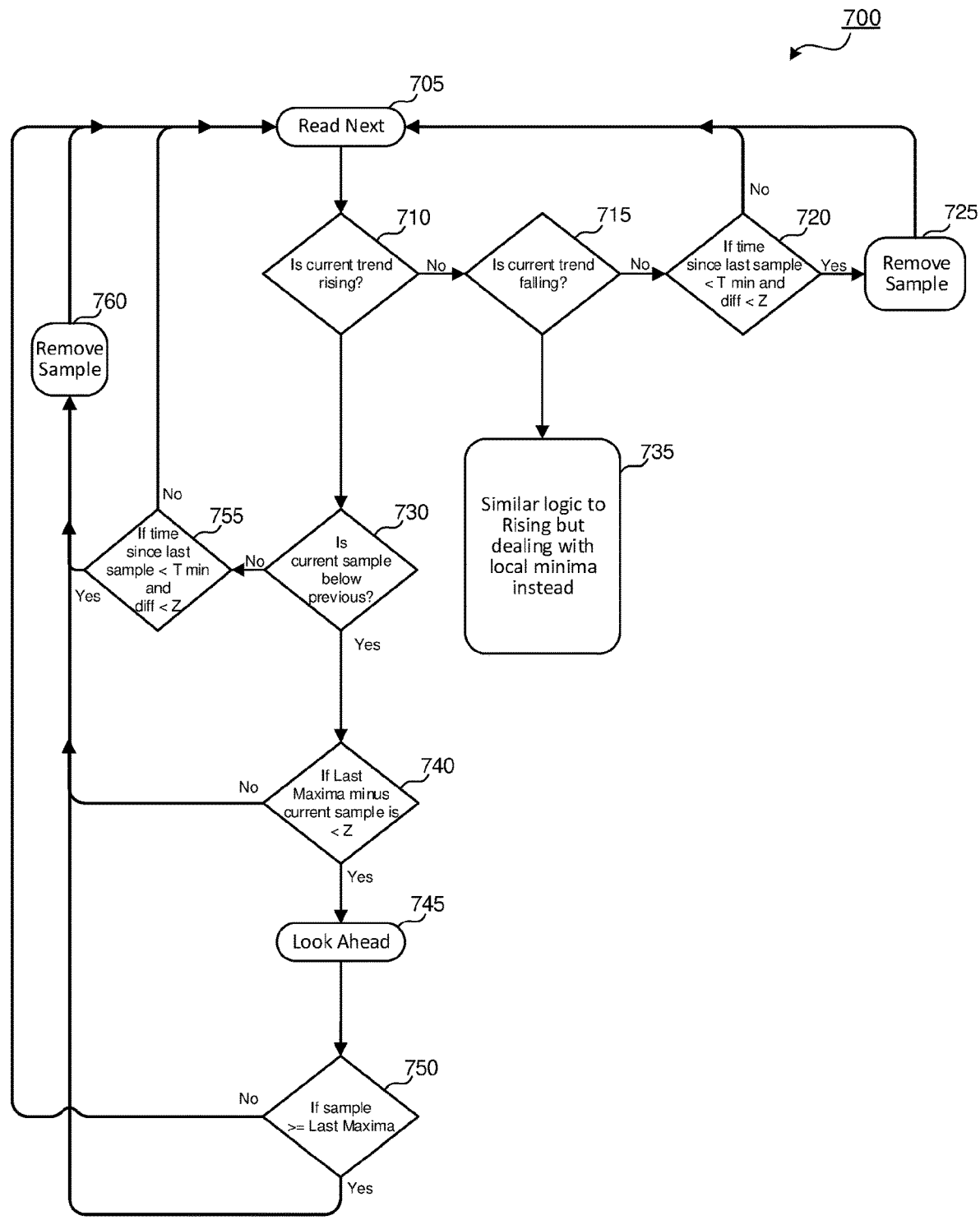
FIG. 7 is a flow diagram of a method for compressing data.

FIG. 7 is a flow diagram of a method 700 for compressing data. The method 700 processes all data sampled since the most recent preceding transmission. Step 705 reads a next available sample point and passes to step 710, which determines if the current trend is rising, based on a difference between the read sample point and a preceding sample point. If the current trend is not rising, No, control passes to step 715, which determines if the current trend is falling. If the current trend is falling, Yes, control passes to step 735, which deals with local minima and uses the same logic as described for the rising trend.

Returning to step 715, if the current trend is not falling, No, control passes to step 720, which determines if the time that has passed since the last sample is less than T minutes and the difference is less than Z, where "T" is the maximum duration between compressed samples and "Z" is the minimum reference unit of the samples being measured (e.g., cm for water level measurement of a water reservoir). If Yes, control passes to step 725, which removes the sample and returns control to step 705 to process further samples. If No, control returns directly to step 725.

Returning to step 710, if the current trend is rising, Yes, control passes to step 730, which determines if the current sample being processed is below the previous sample. If Yes, control passes to step 740, which determines if the last maxima minus the current sample is less than Z. If Yes, control passes to step 745, which looks ahead and then passes control to step 750, which determines if the sample is greater than or equal to the last maxima. If Yes, control passes to step 760, which removes the current sample and returns control to step 705. If at step 750 the sample is not greater than or equal to the last maxima, No, control passes to step 705.

Returning to step 730, if the current sample is not below the previous sample, No, control passes to step 755, which determines if the time since the last sample is less than T minutes and the difference is less than Z. If Yes, then control passes to step 760. If No, control passes to step 705.

Method of Monitoring and Transmission Management

Figure 8:
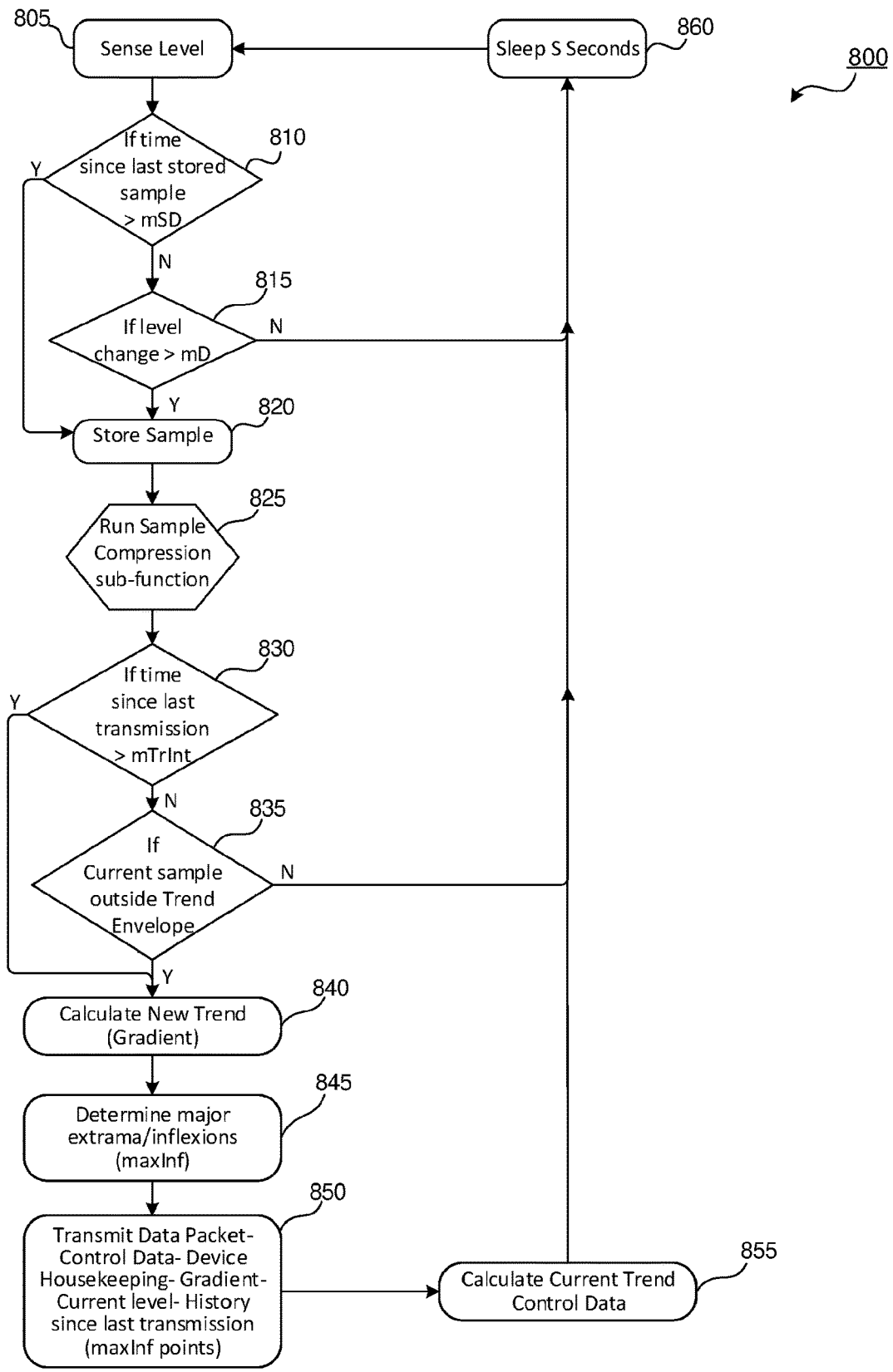
FIG. 8 is a flow diagram of a method for monitoring and transmission management.

FIG. 8 is a flow diagram of a method for monitoring and transmission management in accordance with the present disclosure. In the example of FIG. 4, the functionality of the method 800 is implemented by a software application executing on a custom-built computing device, or other programmable computing device implementing the remote monitor (data sensor) 410. The method begins at step 805, which senses a current level and passes to step 810, which determines if the time since the last stored sample is greater than msD, the maximum duration between samples (measured, in this example, in minutes). If No, control passes to step 815, which determines if the level change is greater than mD, the minimum level change to be treated as significant (i.e., beyond the noise threshold and measured, in this example, in cm). If the minimum level change is not greater than mD, control passes to step 860, which sleeps for a predefined period of S seconds, wherein S is the duration between level sensing, and then returns to step 805. If the minimum level change is greater than mD, Yes, control passes to step 820, which stores the sample.

Returning to step 810, if the time since the last stored sample is greater than msD, Yes, control passes to step 820. From step 820, control passes to step 825, which runs sample compression sub-functional and then passes control to step 830. Step 830 determines if the time since the last transmission is greater than mTrInt, which is the maximum interval between transmissions, measured in minutes. If No, control passes to step 835, which determines if the current sample is outside a trend envelope. If No, control returns to step 860. If Yes, control passes from step 835 to step 840 to calculate a new trend (gradient). Returning to step 830, if the time since the last transmission is greater than mTrInt, control passes from step 830 directly to step 840.

Control passes from step 840 to step 845, which determines major extrema (maxInf), where maxInf is the maximum number of data point in a transmission packet. Control then passes to step 850, which transmits a data packet that includes control data, device housekeeping data, gradient, current sampled level, and history since the last transmission, up to a maximum of maxInf sample points. Control passes to step 855, which calculates the current trend control data and then control is passed to step 860.

Tracking a Liquid Storage Level

Figure 9:
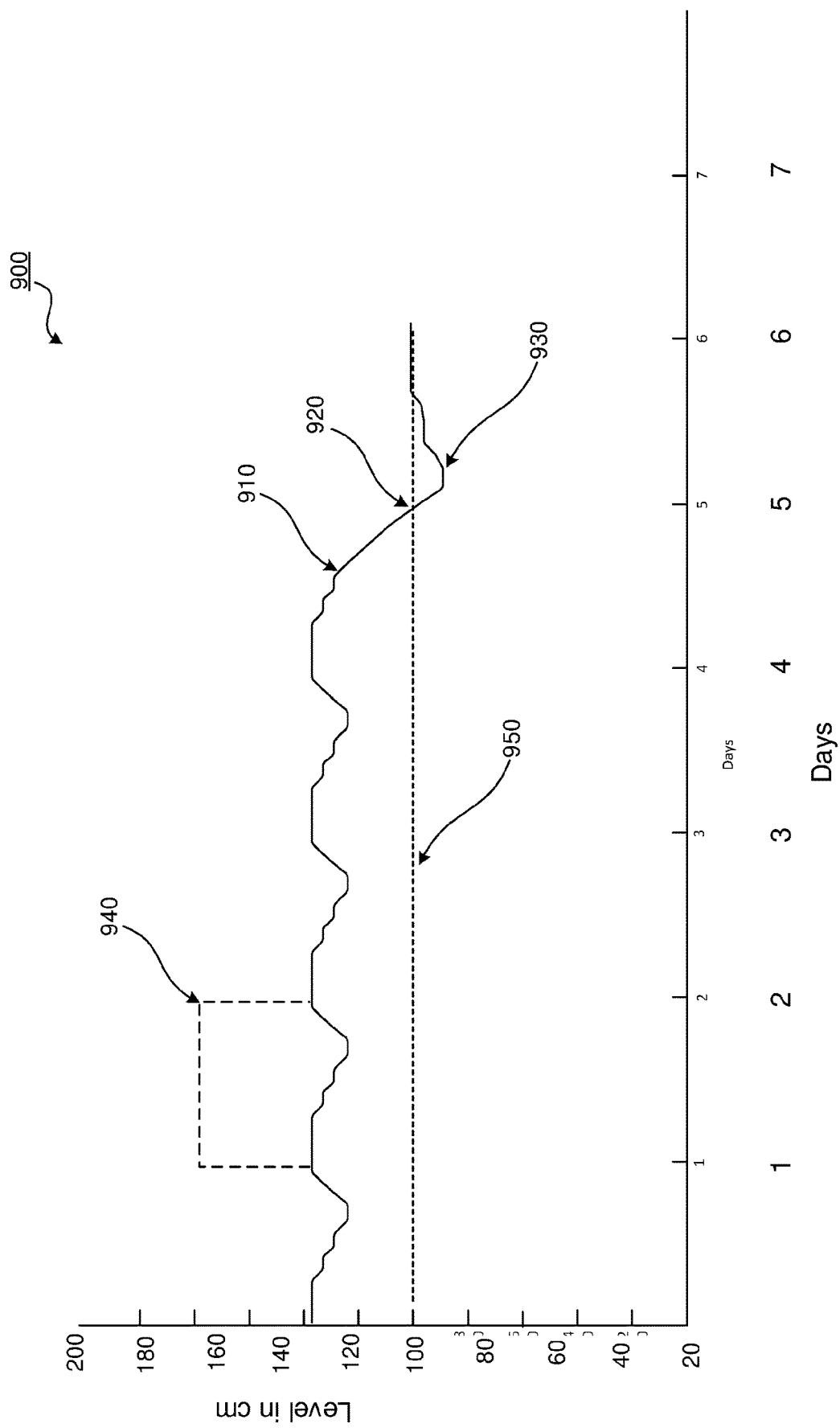
FIG. 9 illustrates tracking of a liquid storage level.

FIG. 9 is a graph 900 that illustrates tracking of a liquid storage level, such as stock water that has a typical diurnal cycle based on consumption and replenishment, which may be by a solar or other regulated pump. When an issue occurs, a remote monitor of the system identifies trend changes that result in transmission by the remote monitor of a packet of data that will communicate to a central server of the system any untoward trends and allow alerts on the central server to warn the user to potential issues in a near real time fashion.

The typical diurnal cycle of liquid consumption and refill is visible on the graph 900 over time, highlighted, for example, at the period identified at 940. As soon as a new trend starts and current points move out of the existing trend envelope, such as at point 910, then the remote monitor generates and sends a transmission to the central server. This transmission updates the server that there is a falling trend of X and the remote monitor of the system will not need to send again till the trend changes or a maximum send interval has elapsed.

In the example of FIG. 9, a user has set a lower alert limit 950 of 100 cm, such that an alert is to be issued if the level of the liquid reaches 100 cm. At point 920 of the graph, the liquid level reaches the user lower alert limit, indicating that the measured level of liquid has fallen to the user-defined lower alert limit of 100 cm. The server generates an alert based on actual values or the forecast trend, wherein the alert warns the user of the lower alert limit event. The outcome of the system is that the system minimises data transmissions, thus reducing costs, but providing a responsive (near real time) service. At point 930 of the graph 900, the user rectifies an anomalie on the reticulation system, resulting in the liquid storage level increasing.

Water Level Trend Analysis

Figure 10A:
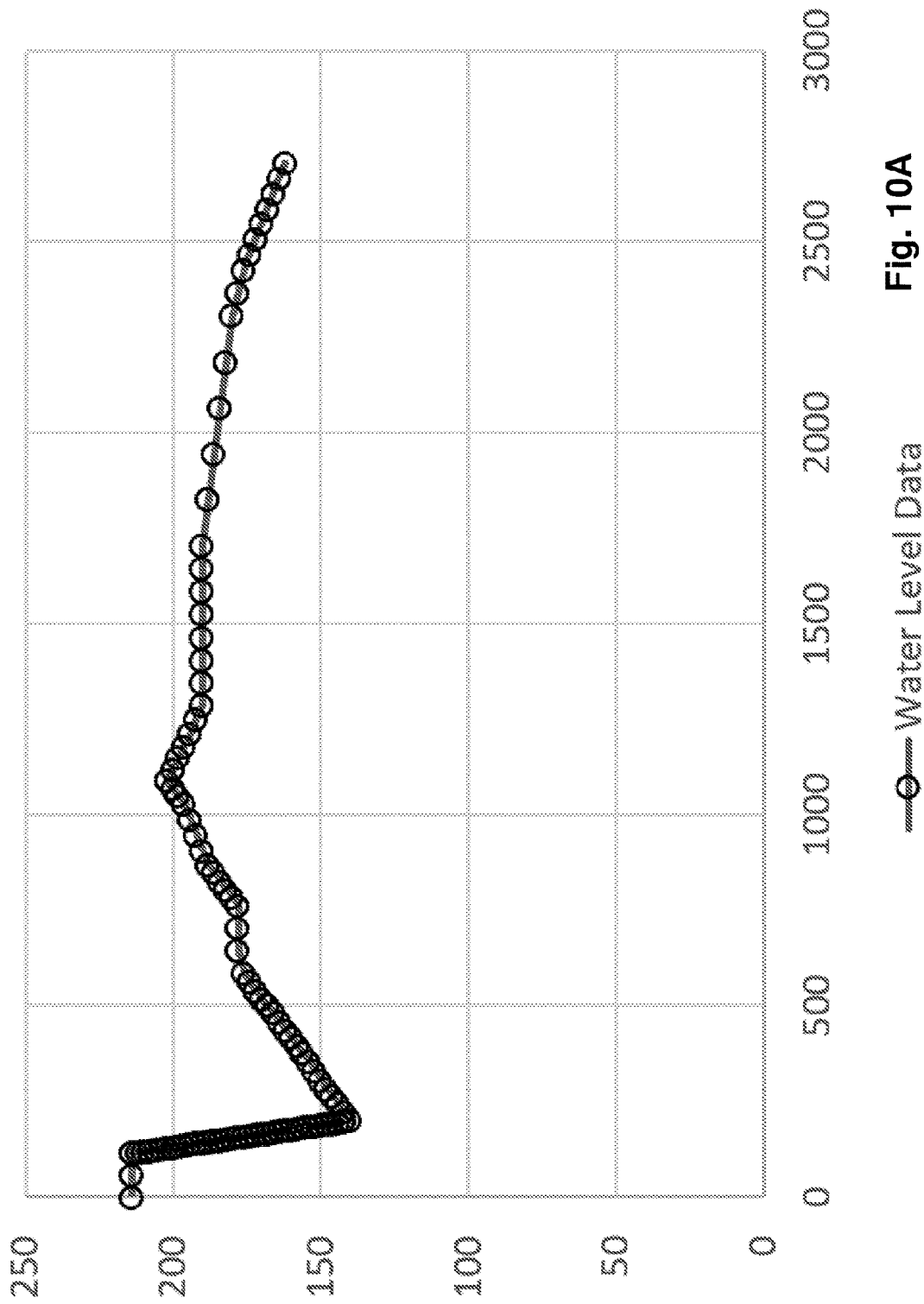
FIGS. 10A-C illustrate a water level trend analysis.
Figure 10B:
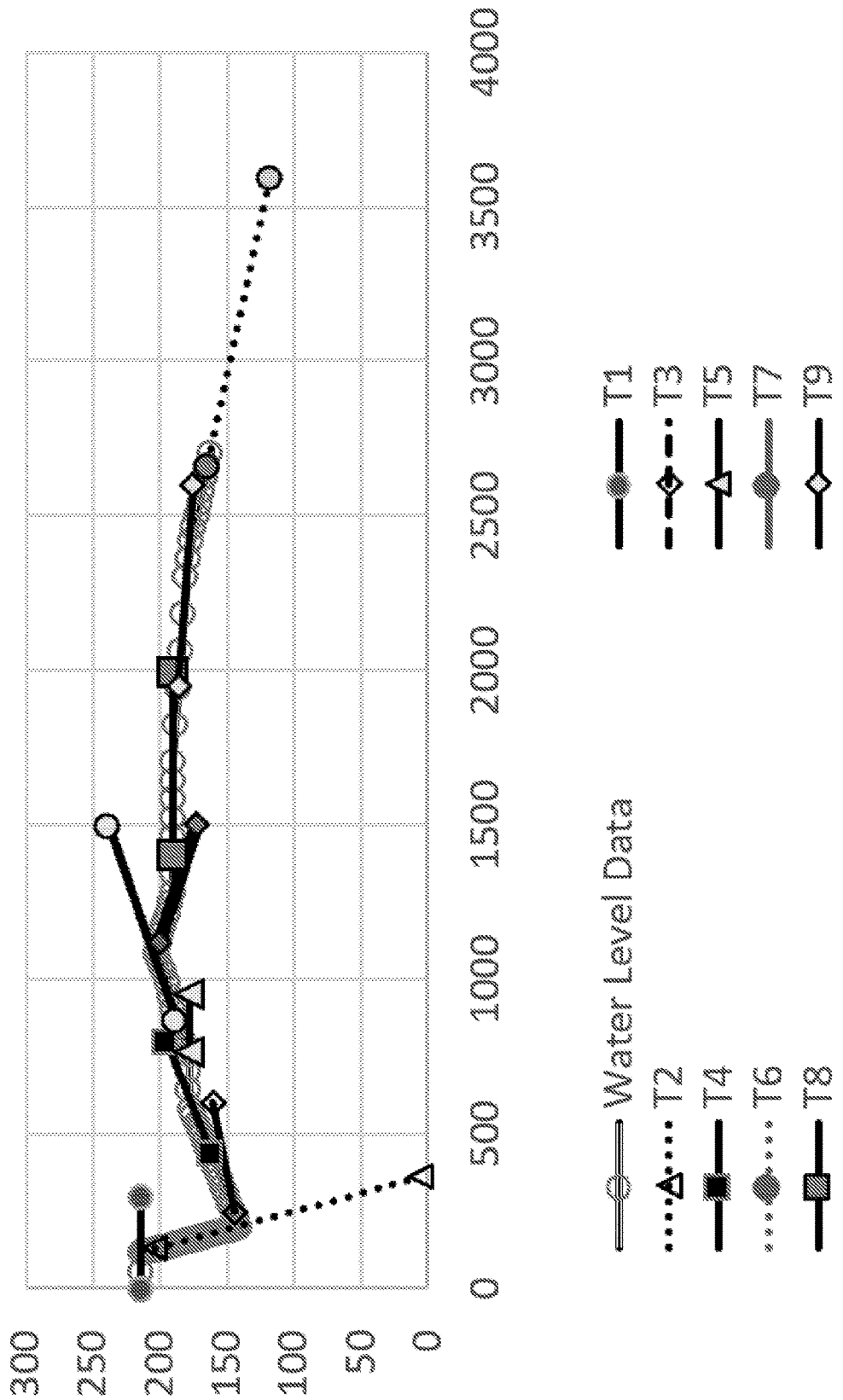
Figure 10C:
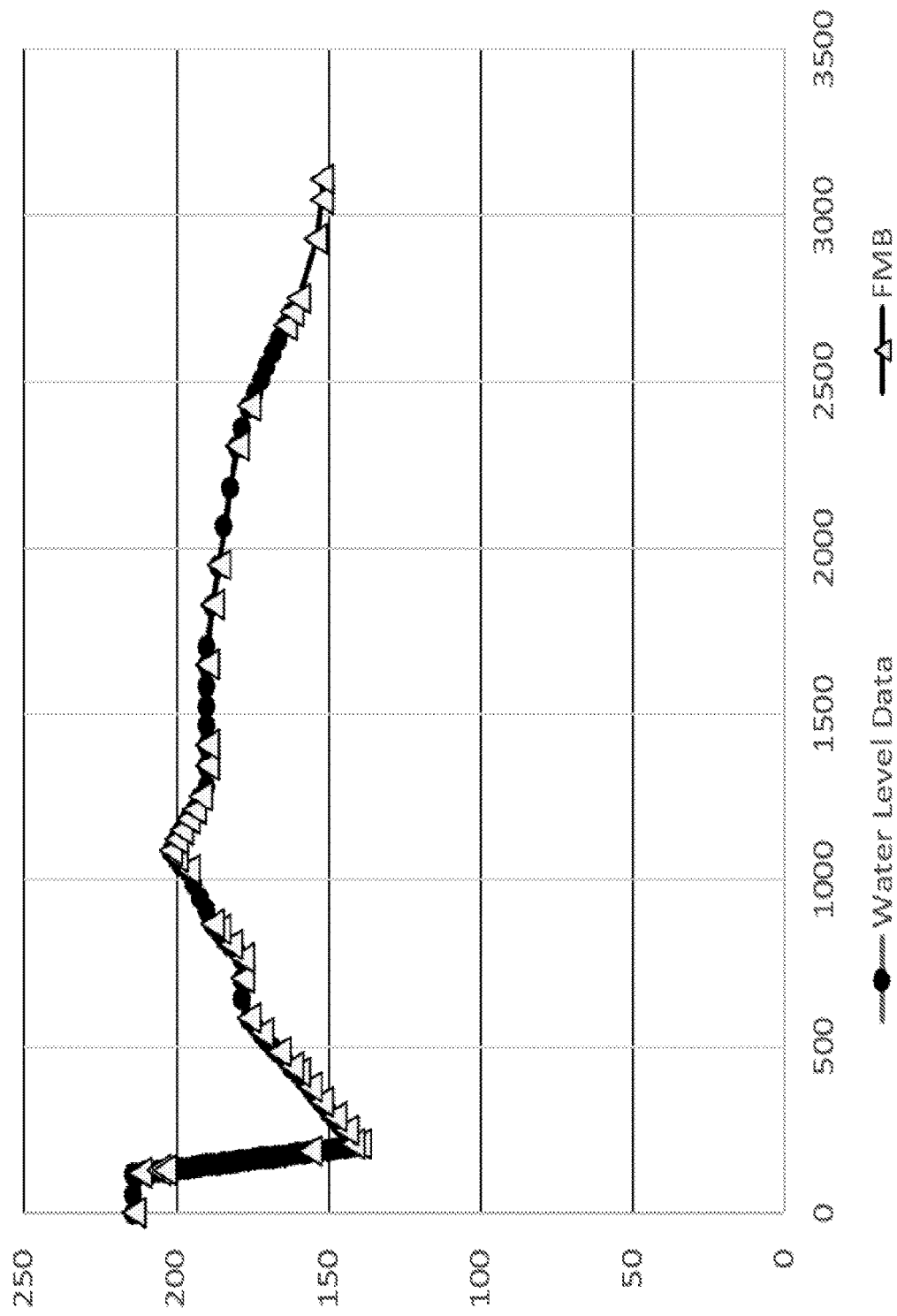

FIGS. 10A-C illustrate an example based on sampling the water level from a farm tank. FIG. 10A is a graph illustrating the water level over time, with the water level measured in cm and the x-axis tracking time in minutes. In this example, a sensing device sampled the water level periodically, recording 108 data points over a 2 day period. Transmitting data points each time the sensing device samples the water level would be prohibitively expensive in a scenario in which satellite communications is the available transmission medium.

FIG. 10B illustrates trend analysis performed on the sampled data points from FIG. 10A, wherein the analysis determines a series of points where the actual water level deviated from the forecast by more than a predefined envelope width, causing the transmission management application to calculate a new trend and initiating a data transmission. In contrast to transmitting every sampled data point, this technique results in 10 transmissions over the 2 day period.

FIG. 10O is a graph illustrating the data points sent in the 10 transmissions overlaid over the actual water level, covering all key data extrema and yielding a total of 40 points, rather than 108. The effect of transmitting in accordance with the present disclosure is more effective power management and use of transmission bandwidth.

INDUSTRIAL APPLICABILITY

The arrangements described are applicable to the monitoring, telecommunication and agricultural industries.

The foregoing describes only some embodiments of the present invention, and modifications and/or changes can be made thereto without departing from the scope and spirit of the invention, the embodiments being illustrative and not restrictive.

In the context of this specification, the word "comprising" and its associated grammatical constructions mean "including principally but not necessarily solely" or "having" or "including", and not "consisting only of". Variations of the word "comprising", such as "comprise" and "comprises" have correspondingly varied meanings.

As used throughout this specification, unless otherwise specified, the use of ordinal adjectives "first", "second", "third", "fourth", etc., to describe common or related objects, indicates that reference is being made to different instances of those common or related objects, and is not intended to imply that the objects so described must be provided or positioned in a given order or sequence, either temporally, spatially, in ranking, or in any other manner.

Although the invention has been described with reference to specific examples, it will be appreciated by those skilled in the art that the invention may be embodied in many other forms.

We claim:

1. A method of transmission management for data acquired by a remote monitor having a sensor and a transmitter, said method comprising the steps of:
defining an initial trend envelope, said initial trend envelope having a window around a forecast trend gradient, said window defined by an initial upper bound and an initial lower bound;
said remote monitor processing a set of data points acquired by said sensor and identifying one or more data points outside said initial trend envelope;
said remote monitor, in response to identifying the one or more points outside said initial trend envelope:
(i) identifying a set of extrema points within said set of data points;
(ii) grading said identified extrema points, based on a change in direction and overall minimum to maximum difference;
(iii) determining a set of history points corresponding to major extrema points selected from said identified extrema points, based on the grading;
(iv) said transmitter transmitting an event data packet to a central server, said data packet including said identified data point, a gradient associated with said identified data point, and said set of history points; and
(v) identifying a subsequent trend envelope based on a trend gradient derived from a preceding set of data points, said preceding set of points including said identified point.

2. The method according to claim 1, wherein said window is regular above and below said forecast trend gradient, said initial upper bound and said initial lower bound being equidistant from said forecast trend gradient.

3. The method according to claim 1, wherein said initial trend envelope is defined based on an initial set of data points corresponding to an initial monitoring time period.

4. The method according to claim 1, wherein said initial trend envelope is defined based on a set of historical data.

5. The method according to claim 1, wherein said initial trend envelope is user defined.

6. The method according to claim 1, comprising the further step of:
transmitting to said central server a timeout data packet that includes a most recent data point and a gradient associated with said most recent data point, when a predefined maximum time period has expired since a previous transmission to said central server.

7. The method according to claim 1, wherein in said event data packet, said identified data point and each said history point is represented by a time offset and a value corresponding to the respective point.

8. The method according to claim 1, wherein determining said set of history points is further based on a predefined maximum number of points to be sent in a single transmission.

9. The method according to claim 1, comprising the further steps of:
processing a subsequent set of data points acquired by said sensor in one or more subsequent time intervals;
for each subsequent time interval:
identifying one or more points outside said subsequent trend envelope in that time interval; and
in response to identifying the one or more points outside said subsequent trend envelope:
repeating steps (i) to (v) for said subsequent set of data points in that subsequent time interval.

10. A remote monitor comprising:
a sensor;
a database for storing data acquired by said sensor;
a transmitter;
a processor; and
a memory storing computer code instructions that when executed on the processor perform operations comprising:
defining an initial trend envelope for data acquired by said sensor, said initial trend envelope having a window around a forecast trend gradient, said window defined by an initial upper bound and an initial lower bound;

processing a set of data points acquired by said sensor and identifying one or more data points outside said initial trend envelope;
  in response to identifying the one or more points outside said initial trend envelope:
    (i) identifying a set of extrema points within said set of data points;
    (ii) grading said identified extrema points, based on a change in direction and overall minimum to maximum difference;
    (iii) determining a set of history points corresponding to major extrema points selected from said identified extrema points, based on the grading;
    (iv) transmitting by said transmitter, to a central server, an event data packet, said event data packet including said identified data point a gradient associated with said identified data point, and said set of history points; and
    (v) identifying a subsequent trend envelope based on a trend gradient derived from a preceding set of data points, said preceding set of points including said identified point.

11. The remote monitor according to claim 10, wherein said window is regular above and below said forecast trend gradient, said initial upper bound and said initial lower bound being equidistant from said forecast trend gradient.

12. The remote monitor according to claim 10, wherein in said event data packet, said identified data point and each said history point is represented by an offset and a value corresponding to the respective point.

13. The remote monitor according to claim 10, wherein determining said set of history points is further based on a predefined maximum number of points to be sent in a single transmission.

14. The remote monitor according to claim 10, wherein the computer code instructions when executed on the processor perform the further operations comprising:
  processing a subsequent set of data points acquired by said sensor in one or more subsequent time intervals;
  for each subsequent time interval:
    identifying one or more points outside said subsequent trend envelope in that time interval; and
    in response to identifying the one or more points outside said subsequent trend envelope:
      repeating steps (i) to (v) for said subsequent set of data points in that subsequent time interval.

15. A remote monitoring system comprising:
  a remote monitor comprising:
    a sensor;
    a database for storing data acquired by said sensor;
    a transmitter for coupling to a communications network;
    a processor; and
    a memory storing computer code instructions that when executed on the processor perform operations comprising:
      defining an initial trend envelope for data acquired by said sensor, said initial trend envelope having a window around a forecast trend gradient, said window defined by an initial upper bound and an initial lower bound;
      processing a set of data points acquired by said sensor and identifying one or more data points outside said initial trend envelope;
      in response to identifying one or more points outside said initial trend envelope:
        (i) identifying a set of extrema points within said set of data points;
        (ii) grading said identified extrema points, based on a change in direction and overall minimum to maximum difference;
        (iii) determining a set of history points corresponding to major extrema points selected from said identified extrema points, based on the grading;
        (iv) transmitting by said transmitter an event data packet, said event data packet including said identified data point, a gradient associated with said identified data point, and said set of history points; and
        (v) identifying a subsequent trend envelope based on a trend gradient derived from a preceding set of data points, said preceding set of points including said identified point; and
    a central server coupled to said communications network, said central server programmed to:
      receive said transmitted event data packet; and
      display a dashboard to a user computing device, said dashboard displaying dashboard information based on said event data packet transmitted from said remote monitor.

16. The system according to claim 15, wherein said dashboard information includes points received in said event data packet.

17. The system according to claim 15, wherein said dashboard information includes said revised trend envelope.

18. The system according to claim 15, wherein said computer code instructions when executed on the processor perform further operations comprising:
  transmitting to said central server a timeout data packet that includes a most recent data point and a gradient associated with said most recent data point, when a predefined maximum time period has expired since a previous transmission to said central server.

19. The system according to claim 15, wherein said central server is further programmed to:
  issue an alert in near-real time based on contents of the event data packet.

20. The remote monitoring system according to claim 15, wherein determining said set of history points is further based on a predefined maximum number of points to be sent in a single transmission.

21. The remote monitoring system according to claim 15, comprising the further steps of:
  processing a subsequent set of data points acquired by said sensor in one or more subsequent time intervals;
  for each subsequent time interval:
    identifying one or more points outside said subsequent trend envelope in that time interval; and
    in response to identifying the one or more points outside said subsequent trend envelope:
      repeating steps (i) to (v) for said subsequent set of data points in that subsequent time interval.

* * * * *